(12) United States Patent
Saxler et al.

(10) Patent No.: US 8,324,005 B2
(45) Date of Patent: Dec. 4, 2012

(54) METHODS OF FABRICATING NITRIDE SEMICONDUCTOR STRUCTURES WITH INTERLAYER STRUCTURES

(75) Inventors: Adam William Saxler, Durham, NC (US); Albert Augustus Burk, Jr., Chapel Hill, NC (US)

(73) Assignee: Cree, Inc., Durham, NC (US)

(*) Notice: Subject to any disclaimer, the term of this patent is extended or adjusted under 35 U.S.C. 154(b) by 0 days.

(21) Appl. No.: 12/907,556

(22) Filed: Oct. 19, 2010

(65) Prior Publication Data

US 2011/0312159 A1    Dec. 22, 2011

Related U.S. Application Data

(62) Division of application No. 11/716,317, filed on Mar. 9, 2007, now Pat. No. 7,825,432.

(51) Int. Cl.
*H01L 21/00* (2006.01)
(52) U.S. Cl. .............. 438/47; 257/96; 257/190
(58) Field of Classification Search .......... 438/46, 438/47; 257/96, 190, 191, 196
See application file for complete search history.

(56) References Cited

U.S. PATENT DOCUMENTS

| | | | |
|---|---|---|---|
| 34,861 A | 4/1862 | Knowlton | |
| 4,946,547 A | 8/1990 | Palmour et al. | |
| 5,072,122 A | 12/1991 | Jiang et al. | |
| 5,101,109 A | 3/1992 | Jiang et al. | |
| 5,200,022 A | 4/1993 | Kong et al. | |
| 5,210,051 A | 5/1993 | Carter, Jr. | |
| 5,393,993 A | 2/1995 | Edmond et al. | |
| 5,523,589 A | 6/1996 | Edmond et al. | |
| 5,670,798 A | 9/1997 | Schetzina | |
| 5,760,426 A | 6/1998 | Marx et al. | |
| 6,146,916 A | 11/2000 | Nanishi et al. | |
| 6,177,688 B1 | 1/2001 | Linthicum et al. | |
| 6,187,606 B1 * | 2/2001 | Edmond et al. ........ | 438/46 |
| 6,211,095 B1 | 4/2001 | Chen et al. | |

(Continued)

FOREIGN PATENT DOCUMENTS

CN    1599032 A    3/2005

(Continued)

OTHER PUBLICATIONS

Amano et al. "Stress and Defect Control in GaN Using Low Temperature Interlayers" *Jpn. J. Appl. Phys.* 37:L1540-L1542 (1998).

(Continued)

*Primary Examiner* — Zandra Smith
*Assistant Examiner* — Jamie C Niesz
(74) *Attorney, Agent, or Firm* — Myers Bigel Sibley & Sajovec

(57) ABSTRACT

A semiconductor structure includes a first layer of a nitride semiconductor material, a substantially unstrained nitride interlayer on the first layer of nitride semiconductor material, and a second layer of a nitride semiconductor material on the nitride interlayer. The nitride interlayer has a first lattice constant and may include aluminum and gallium and may be conductively doped with an n-type dopant. The first layer and the second layer together have a thickness of at least about 0.5 μm. The nitride semiconductor material may have a second lattice constant, such that the first layer may be more tensile strained on one side of the nitride interlayer than the second layer may be on the other side of the nitride interlayer.

25 Claims, 9 Drawing Sheets

U.S. PATENT DOCUMENTS

| | | | |
|---|---|---|---|
| 6,218,280 | B1 | 4/2001 | Kryliouk et al. |
| 6,218,680 | B1 | 4/2001 | Carter, Jr. et al. |
| 6,265,289 | B1 | 7/2001 | Zheleva et al. |
| 6,325,850 | B1 | 12/2001 | Beaumont et al. |
| 6,350,666 | B2 | 2/2002 | Kryliouk |
| 6,410,940 | B1 | 6/2002 | Jiang et al. |
| 6,455,870 | B1 | 9/2002 | Wang et al. |
| 6,570,192 | B1 | 5/2003 | Davis et al. |
| 6,649,287 | B2 | 11/2003 | Weeks et al. |
| 6,775,314 | B1* | 8/2004 | Waldrip et al. ............. 372/96 |
| 6,818,061 | B2 | 11/2004 | Peczalski et al. |
| 6,841,001 | B2 | 1/2005 | Saxler |
| 6,906,351 | B2 | 6/2005 | Kryliouk et al. |
| 6,967,355 | B2 | 11/2005 | Kryliouk et al. |
| 7,001,791 | B2 | 2/2006 | Kryliouk et al. |
| 7,078,318 | B2 | 7/2006 | Jurgensen et al. |
| 7,128,786 | B2* | 10/2006 | Jurgensen et al. ........... 117/95 |
| 7,193,784 | B2 | 3/2007 | Jiang et al. |
| 7,210,819 | B2 | 5/2007 | Jiang et al. |
| 7,566,576 | B2* | 7/2009 | Murofushi et al. .......... 438/29 |
| 2001/0035531 | A1 | 11/2001 | Kano et al. |
| 2002/0074552 | A1 | 6/2002 | Weeks, Jr. et al. |
| 2003/0006409 | A1 | 1/2003 | Ohba |
| 2003/0070610 | A1 | 4/2003 | Dadgar et al. |
| 2003/0111008 | A1 | 6/2003 | Strittmatter et al. |
| 2005/0025909 | A1 | 2/2005 | Jurgensen et al. |
| 2005/0285141 | A1 | 12/2005 | Piner et al. |
| 2005/0285142 | A1 | 12/2005 | Piner et al. |
| 2006/0006500 | A1 | 1/2006 | Piner et al. |
| 2006/0191474 | A1 | 8/2006 | Chen et al. |
| 2006/0249748 | A1 | 11/2006 | Piner et al. |
| 2006/0286782 | A1* | 12/2006 | Gaska et al. ............. 438/483 |

FOREIGN PATENT DOCUMENTS

| | | | |
|---|---|---|---|
| DE | 10151092 | A1 | 5/2003 |
| DE | 102004034341 | A1 | 2/2006 |
| DE | 102004038573 | A1 | 3/2006 |
| EP | 884767 | A2 | 12/1998 |
| GB | 2 440 484 | A | 1/2008 |
| GB | 2440484 | * | 1/2008 |
| JP | 1155630 | A | 6/1989 |
| JP | 11135832 | A | 5/1999 |
| JP | 11145515 | | 5/1999 |
| JP | 11274079 | A | 7/1999 |
| JP | 2001044124 | A | 2/2001 |
| JP | 2001210863 | | 8/2001 |
| JP | 2001/519603 | | 10/2001 |
| JP | 2002-505519 | | 2/2002 |
| JP | 2003037289 | | 2/2003 |
| JP | 2004179452 | | 6/2004 |
| WO | WO 2005050730 | A1 | 6/2005 |
| WO | WO 2006/123540 | A1 | 11/2006 |

OTHER PUBLICATIONS

Biäsing et al. "The origin of stress reduction by low-temperature AlN interlayers" *Applied Physics Letters* 81(15):2722-2724 (2002).

Charles et al. "Growth of Uncracked $Al_{0.80}Ga_{0.20}N$/GaN DBR on Si(111)" *Mater. Res. Soc. Symp. Proc.* 831:E3.17.1-E3.17.5 (2005).

Chen et al. "Effect of Al content on the microstructure in GaN grown on Si by MOVPE" *phys. stat. Sol. (c)* 0(7):2181-2184 (2003).

Cheng et al. "Flat GaN Epitaxial Layers Grown on Si(111) by Metalorganic Vapor Phase Epitaxy Using Step-Graded AlGaN Intermediate Layers" *Journal of Electronic Materials* 35(4):592-598 (2006).

Dadgar et al. "Metalorganic Chemical Vapor Phase Epitaxy of Crack-Free GaN on Si(111) Exceeding 1μm in Thickness" *Jpn. J. Appl. Phys.* 39:L1183-L1185 (2000).

Dadgar et al. "Crack-Free InGaN/GaN Light Emitters on Si(111)" *phys. stat. sol. A (a)* 188(1):155-158 (2001).

Dadgar et al. "Bright, Crack-Free InGaN/GaN Light Emitters on Si(111)" *phys. stat. sol (a)* 192(2):308-313 (2002).

Dadgar et al. "Thick, crack-free blue light-emitting diodes on Si(111) using low-temperature AlN interlayers and in situ $Si_xN_y$ masking" *Applied Physics Letters* 80(20):3670-3672 (2002).

Dadgar et al. "Metalorganic chemical vapor phase epitaxy of gallium-nitride on silicon" *phys. stat. sol. (c)* 0(6):1583-1606 (2003).

Dikme et al. "Si(111) as alternative substrate for fAlGaN/GaN HEMT" *phys. stat, sol. (c)* 0(7):2385-2388 (2003).

Dobos et al. "Microstructure of GaN layers grown on Si(111) revealed by TEM" *Vacuum* 71:285-291 (2003).

Elhamri et al. "An electrical characterization of a two-dimensional electron gas in GaN/AlGaN on silicon substrates" *Journal of Applied Physics* 95(121):7982-7989 (2004).

Elhamri et al. "A Magnetotransport Study of AlGaN/GaN Heterostructures on Silicon" *Journal of Electronic Materials* 34(4):444-449 (2005).

Feltin et al. "Crack-Free Thick GaN Layers on Silicon (111) by Metalorganic Vapor Phase Epitaxy" *phys. stat. sol. (a)* 188(2):531-535 (2001).

Hikita et al. "AlGaN/GaN Power HFET on Silicon Substrate With Source-Via Grounding (SVG) Structure" *IEEE Transactions on Electron Devices* 52(9):1963-1967 (2005).

Iwakami et al. "AlGaN/GaN Heterostructure Field-Effect Transistors (HFETs) on Si Substrates for Large-Current Operation" *Japanese Journal of Applied Physics* 43(7A):L831-L833 (2004).

Krost et al. "GaN-Based Devices on Si" *phys. stat. sol. (a)* 194(2):361-365 (2002).

Krost et al. "Simultaneous measurement of wafer curvature and true temperature during metalorganic growth of group-III nitrides on silicon and sapphire" *phys. stat. sol. (b)* 242(13):2570-2574 (2005).

Krost et al. "In situ monitoring of the stress evolution in growing group-III-nitride layers" *Journal of Crystal Growth* 275:209-216 (2005).

Lahrèche et al, "Growth of GaN on (111) Si: a route towards self-supported GaN" *Journal of Crystal Growth* 231:329-334 (2001).

Rossow et al. "Influence of low-temperature interlayers on strain and defect density of epitaxial GaN layers" *Journal of Crystal Growth* 248:528-532 (2003).

Wu et al. "Crack-free GaN/Si(111) epitaxial layers grown with InAlGaN alloy as compliant interlayer by metalorganic chemical vapor deposition" *Journal of Crystal Growth* 279:335-340 (2005).

Wu et al. "Crack control in GaN grown on silicon (111) using in doped low-temperature AlGaN interlayer by metalorganic chemical vapor deposition" *Optical Materials* 28:1227-1231 (2006).

Able et al. "Growth of crack-free GaN on Si(111) with graded AlGaN buffer layers" *Journal of Crystal Growth* 276:41 5-418 (2005).

Arulkumaran et al. "Enhancement of breakdown voltage by AlN buffer layer thickness in AlGaN/GaN high-electron-mobility transistors on 4 in. diameter silicon" *Applied Physics Letters* 86:123503-123503-3 (2005).

Arulkumaran et al. "Studies of AlGaN/GaN high-electron-mobility transistors on 4-in. diameter Si and sapphire substrates" *Solid-State Electronics* 49:1632-1638 (2005).

Chang at al. "Effect of Buffer Layers on Electrical, Optical and Structural Properties of AlGaN/GaN Heterostructures Grown on Si" *Japanese Journal of Applied Physics* 45(4A):2516-2518 (2006).

Chen et al. Growth of high quality GaN layers with AlN buffer on Si(111) substrates) *Journal of Crystal Growth* 225:150-153 (2001).

Clos at al, "Wafer curvature in the nonlinear deformation range" *phys. stat. sol. (a)* 201(11):R75-.R78 (2004).

Cong et al. "Design of the low-temperature AlN interlayer for GaN grown on Si (111) substrate" *Journal of Crystal Growth* 276:381-388 (2005).

Contreras et al. "Dislocation annihilation by silicon delta-doping in GaN epitaxy on Si" *Applied Physics Letters* 81(25):4712-4714 (2002).

Dadgar et al. Reduction of stress at the initial stages of GaN growth on Si(111) *Applied Physics Letters* 82(1):28-30 (2003).

Dadgar et al. "MOVPE growth of GAN on Si(111) substrates" *Journal of Crystal Growth* 248:556-562 (2003).

Dadgar at al. "Gallium-nitride-based devices on silicon" *phys. stat. sol. (c)* 0(6):1940-1949.

Dadgar et al. "In situ measurements of strains and stresses in GaN heteroepitaxy and its impact on growth temperature" *Journal of Crystal Growth* 272:72-75 (2004).

Davies et al. "Fabrication of GaN cantilevers on silicon substrates for microelectromechanical devices" *Applied Physics Letters* 84(14):2566-2568 (2004).

Davies et al. "Fabrication of epitaxial III-nitride cantilevers on silicon (111) substrates" *Journal of Materials Science: Materials in Electronics* 15:705-710 (2004).

Fehse et al. "Impact of thermal annealing on the characteristics of InGaN/GaN LEDs on Si(111)" *Journal of Crystal Growth* 272:251-256 (2004).

Hu et al. "Microstructure of GaN films grown on Si(111) substrates by metalorganic chemical vapor deposition" *Journal of Crystal Growth* 256:416-423 (2003).

Ikeda et al. "High-performance normally off FET using an AlGaN/GaN heterostructure on Si substrate" *Journal of Crystal Growth* 275:e1091-e1095 (2005).

Ikeda et al. "Normally-off operation GaN HFET using a thin AlGaN layer for low loss switching devices" *Mater. Res. Soc. Symp. Proc.* 831:E6.5.1-E6.5.6 (2005).

Ishikawa at al. "GaN on Si Substrate with AlGaN/AlN Intermediate Layer" *Jpn. J. Appl. Phys.* 38:L492-L494 (1999).

Ishikawa et al. "Growth of GaN on 4-inch Si substrate with a thin AlGaN/AlN intermediate layer" *phys. stat. sol. (c)* 0(7):2177-2180 (2003).

Ishikawa et al. "Improved characteristics of GaN-based light-emitting diodes by distributed Bragg reflector grown on Si" *phys. stat, sol. (a)* 201(12):2653-2657 (2004).

Ishikawa et al. "Characterization of GaInN light-emitting diodes with distributed Bragg reflector grown on Si" *Journal of Crystal Growth* 272:322-326 (2004).

Jamil et al. "Dislocation Reduction and Structural Properties of GaN layers Grown on $N^+$-implanted ALN/Si (111) Substrates" *Mater. Res. Soc. Symp. Proc.* 892:0892-FF22-03.1-0892-FF22-03.6 (2006).

Jang et al. "The influence of $Al_xGa_{1-x}N$ intermediate buffer layer on the characteristics of GaN/Si(111) epitaxy" *Journal of Crystal Growth* 255:220-226 (2003).

Jang et al. "High-quality GaN/Si(111) epitaxial layers grown with various Al0.3Ga0.7N/GaN superlattices as intermediate layer by MOCVD" *Journal of Crystal Growth* 253:64-70 (2003).

Joblot et al. "Hexagonal *c*-axis GaN layers grown by metalorganic vapor-phase epitaxy on Si(001)" *Journal of Crystal Growth* 280:44-53 (2005).

Katona et al. "Effect of the Nucleation Layer on Stress during Cantilever Epitaxy of GaN on Si (111)" *phys. stat. sol. (a)* 194(2):550-553 (2002).

Kim et al. "N-type doping of GaN/Si(111) using $Al_{0.2}Ga_{0.8}N$/ALN composite buffer layer and Al0.2Ga0.8N/GaN superlattice" *Journal of Crystal Growth* 286:235-239 (2006).

Komiyama et al. "Suppression of crack generation in GaN epitaxy on Si using cubic SiC as intermediate layers" *Applied Physics Letters* 88:091901-1-091901-3 (2006).

Kondo et al. "Series Resistance in n-GaN/AlN/n-Si Heterojunction Structure" *Japanese Journal of Applied Physics* 45(5A):4015-4017 (2006).

Krost et al. "GaN-based epitaxy on silicon: stress measurements" *phys. stat. sol. (a)* 200(1):26-35 (2003).

Krost et al. "Heteroepitaxy of GaN on Silicon: In Situ measurements" *Materials Science Forum* 483-485:1051-1056 (2005).

Kryliouk et al. "Controlled Synthesis of Single-Crystalline InN Nanorods" *Symposium E Science and Technology of Nanotubes and Nanowires* (2006) Abstract <http://www.emrs-strasbourg.com/index.php?option=com_abstract&task=view&id=5&Itemid=64> also published as Kryliouk et al. "Controlled Synthesis of Single-Crystalline InN Nanorods" *Nanotechnology* 18:1-6 (2007).

Lee et al. "Growth and optical properties of GaN on Si(111) substrates" *Journal of Crystal Growth* 235:73-78 (2002).

Lee et al. "Reduction of dislocations in GaN epilayers grown on Si(111) substrate using $Si_xN_y$ inserting layer" *Applied Physics Letters* 85(9):1502-1504 (2004).

Lee et al. "Growth of crack-free GaN films on Si(111) substrate and improvement of the crystalline quality using $Si_xN_y$ inserting layer" *phys. stat. sol. (c)* 2(7):2104-2108 (2005).

Li et al. "Growth of III-nitride photonic structures on large area silicon substrates" *Applied Physics Letters* 88:171909-171909-3 (2006).

Liu et al. Atomic arrangement of the AlN/Si (111 interface) *Applied Physics Letters* 83(5):860-862 (2003).

Lu et al. "Influence of the growth temperature of the high-temperature AlN buffer on the properties of GaN grown on Si(111) substrate" *Journal of Crystal Growth* 263:4-11 (2004).

Lu et al. "Growth of crack-free GaN films on Si(111) substrate by using Al-rich AlN buffer layer" *Journal of Applied Physics* 96(9):4982-4988 (2004).

Lu et al. "Depth distribution of the strain in the GaN layer with low-temperature AlN interlayer on Si(111) substrate studied by Rutherford backscattering/channeling" *Applied Physics Letters* 85(23):5562-5564 (2004).

Mo et al. "Growth and characterization of InGaN blue LED structure on Si(111) by MOCVD" *Journal of Crystal Growth* 285:312-317 (2005).

Pal et al, "Silicon—a new substrate for GaN growth" *Bull. Mater. Sci.* 27(6):501-504 (2004).

Poschenrieder et al. "MOCVD-Grown InGaN/GaN MQW LEDs on Si(111)" *phys. stat. sol. (c)* 0(1):267-271 (2002).

Raghavan et al. "Intrinsic stresses in AlN layers grown by metal organic chemical vapor deposition on (0001) sapphire and (111) Si substrates" *Journal of Applied Physics* 96(5):2995-3003 (2004).

Raghavan et al. "In situ stress measurements during the MOCVD growth of AlN buffer layers on (111) Si substrates" *Journal of Crystal Growth* 261:294-300 (2004).

Reiher et al. "Efficient stress relief in GaN heteroepitaxy on Si(111) using low-temperature AlN interlayers" *Journal of Crystal Growth* 248:563-567 (2003).

Schulze et al. "Growth of single-domain GaN layers on Si(001) by metalorganic vapor-phase epitaxy" *Journal of Crystal Growth* 289:485-488 (2006).

Schulze et al. "Metalorganic vapor phase epitaxy grown InGaN/GaN light-emitting diodes on Si(001) substrate" *Applied Physics Letters* 88:121114-121114-3 (2006).

Strittmatter et al. "High Quality GaN Layers Grown by Metalorganic Chemical Vapor Deposition on Si(111) Substrates" *phs. stat. sol. (a)* 176:611-614 (1999).

Strittmatter et al. "Structural investigation of GaN layers grown on Si(111) substrates using a nitridated A1As buffer layer" *Journal of Crystal Growth* 221:293-296 (2000).

Sugahara et al. "Role of AlN/GaN Multilayer in Crack-Free GaN Layer Growth on 5" Ø Si (111) Substrate" *Japanese Journal of Applied Physics* 43(12B):L1595-L1597 (2004).

Takemoto et al. "Growth of GaN Directly on Si(111) Substrate by Controlling Atomic Configuration of Si Surface by Metalorganic Vapor Phase Epitaxy" *Japanese Journal of Applied Physics* 45(18):L478-L481 (2006).

Uen et al. "Epitaxial growth of high-quality GaN on appropriately nitridated Si substrate by metal organic chemical vapor deposition" *Journal of Crystal Growth* 280:335-340 (2005).

University of Florida "Method for Producing Crack-free Nitride Films" 2 pages (believed prior to 2006).

Venugopal et al. "Comparison of Various Buffer Schemes to Grow GaN on Large-Area Si(111) Substrates Using Metal-Organic Chemica-Vapor Deposition" *Journal of Electronic Materials* 32(5):371-374 (2003).

Wang et al. "Effects of periodic delta-doping on the properties of GaN:Si films grown on Si(111) substrates" *Applied Physics Letters* 85(24):5881-5883 (2004).

Wang et al. "Deposition of AlGaN films on (111) Si substrates and optimization of GaN growth on Si using intermediate-temperature AlGaN buffer layers" *Thin Solid Films* 493:135-138 (2005).

Weng et al. "Stress and Microstructure Evolution in Compositionally Graded $al_{1-x}Ga_xN$ Buffer Layers for GaN Growth on Si" *Mater. Res. Soc. Symp. Proc.* 892:0892-FF02-02.1-0892-FF02-02.6 (2006).

Wu et al. "Effect of the N/Al ratio of AlN buffer on the crystal properties and stress state of GaN.film grown on Si(111) substrate" *Journal of Crystal Growth* 260:331-335 (2004).

Wu et al. "Crack-free InAlGaN quaternary allow films grown on Si(111) substrate by metalorganic chemical vapor deposition" *Journal of Crystal Growth* 273:79-85 (2004).

Wu et al. "Growth and characterization of GaN/AlGaN high-electron mobility transistors grown on p-type Si substrates" *Physica E* 32:566-568 (2006).

Yoshida et al, "Formation of thin GaN layer on Si (111) for fabrication of high-temperature metal field effect-tra1nsistors (MESFETs)" *Journal of Crystal Growth* 253:85-88 (2003).

Yu et al, "Control and improvement of crystalline cracking from GaN thin films grown on Si by metalorganic chemical vapor deposition" *Thin Solid Films* 498:108-112 (2006).

Zang et al. "Evolution of AlN buffer layers on silicon and effects on the properties of epitaxial GaN films" *phys. stat. sol.* (c) 0(7):2067-2071 (2003).

Zang et al. "The effect of periodic silane burst on the properties of GaN on Si (111) substrates" *Mater. Res, Soc. Symp. Proc.* 837:E3.33.1-E3.33.6 (2005).

Zhang et al. "Influence of high-temperature AlN buffer thickness on the properties of GaN grown on Si(111)" *Journal of Crystal Growth* 258:34-40 (2003).

Zhang et al. "High-Bright InGaN Multiple-Quantum-Well Blue Light-Emitting Diodes on Si (111) Using AlN/GaN Multilayers with a Thin Ain/AlGaN Buffer Layer" *Jpn. J. Appl. Phys.* 42:L226-L228 (2003).

Zhang at al. "Reduction of tensile stress in GaN grown on Si(111) by inserting a low-temperature AlN interlayer" *Journal of Crystal Growth* 270:316-321 (2004).

Zhang et al. "The effect of the $Al_xGa_{1-x}N$/AlN buffer layer on the properties of GaN/Si(111) film grown by $NH_3$-MBE" *Journal of Crystal Growth* 280:346-351 (2005).

Venugopal et al., "Comparison of Various Buffer Schemes to Grow GaN on Large-Area Si(111) Substrates Using Metal-Organic Chemical-Vapor Deposition", Journal of Electronic Materials 32:5, pp. 371-374; XP009098111(2003).

Weng et al., "Evolution of threading dislocations in MOCVD-grown GaN films on (111) Si substrates", Journal of Crystal Growth 300:1, pp. 217-222; XP005915246 (Feb. 28, 2007).

International Search Report and Written Opinion (14 pages) for corresponding International Application No. PCT/US2008/002848; Mailing Date: Sep. 22, 2008.

Test Results 1-1: Oct. 5, 2006.
Test Results 1-2: Sep. 28, 2006.
Test Results 1-3: Sep. 13, 2006.
Test Results 2-1: Jun. 1, 2006.
Test Results 2-2: May 18, 2006.
Test Results 2-3: May 11, 2006.
Test Results 2-4: May 4, 2006.
Test Results 2-5: Jun. 15, 2006.
Test Results 2-6: Jun. 22, 2006.
Test Results 2-7: Jun. 29, 2006.
Test Results 3-1: Jul. 13, 2006.
Test Results 3-2: Aug. 9, 2006.
Test Results 3-3: Aug. 17, 2006.
Test Results 3-4: Aug. 23, 2006.
2006 Data.
2007 Data.
Official Action for corresponding JP application No. 2009-552709 mailed on Sep. 25, 2012.

\* cited by examiner

METHODS OF FABRICATING NITRIDE SEMICONDUCTOR STRUCTURES WITH INTERLAYER STRUCTURES

RELATED APPLICATIONS

The present invention is a divisional of U.S. patent application Ser. No. 11/716,317 filed Mar. 9, 2007 now U.S. Pat. No. 7,825,432, entitled "Nitride Semiconductor Structures With Interlayer Structures And Methods Of Fabricating Nitride Semiconductor Structures With Interlayer Structures" and is related to commonly-assigned U.S. patent application Ser. No. 11/716,319 entitled "Thick Nitride Semiconductor Structures With Interlayer Structures and Methods Of Fabricating Thick Nitride Semiconductor Structures," the disclosures of which are incorporated herein by reference.

FIELD OF THE INVENTION

The present invention relates to semiconductor structures and in particular relates to nitride semiconductor structures and related methods.

BACKGROUND

In the fabrication of semiconductor devices, semiconductor materials may be used that are lattice mismatched with a substrate or underlying layer. For example, GaN is conventionally fabricated on a sapphire substrate, a silicon substrate or a silicon carbide substrate. The unstrained lattice constant of GaN is 3.19 whereas the unstrained lattice constant of sapphire is 4.76 and silicon carbide is 3.07. As a result, the GaN layers grown on the substrate may be strained. If such is the case and if the level of strain exceeds a certain threshold, the GaN layers may crack, which may render the material unacceptable for use in a semiconductor device.

Further difficulties may arise from the fact that different materials may have different coefficients of thermal expansion, which may cause the lattice constant differential between materials to change with temperature. Thus, two materials that are substantially lattice matched at one temperature may be mismatched at a different temperature. Furthermore, an epitaxial layer that is compressively strained at a growth temperature due to a lattice mismatch with an underlying substrate may be tensile strained at room temperature, or vice-versa, depending on the room temperature lattice constants and the coefficients of thermal expansion of the materials.

Process temperatures used in the fabrication of semiconductor materials and devices may be extreme. For example, some epitaxial growth processes may be performed at temperatures in excess of 1000° C., while device annealing temperatures may be even higher. Thus, the difference between process temperatures and room temperature may be as much as 1000° C. or more.

In addition to potentially causing cracking, strain in a semiconductor structure may be detrimental for a number of other reasons. For example, strain may cause a wafer to bow. Wafer bow during epitaxial growth may result in uneven growth of epitaxial layers on a substrate, which may reduce useful device yields. Furthermore, wafer bow may complicate semiconductor manufacturing processes such as planarization and/or dicing.

SUMMARY

A semiconductor structure according to some embodiments of the invention includes a first layer of a nitride semiconductor material, a substantially relaxed nitride interlayer on the first layer of nitride semiconductor material, and a second layer of the nitride semiconductor material on the nitride interlayer. The nitride interlayer has a first lattice constant and may include aluminum and gallium and may be conductively doped with an n-type dopant, such as silicon and/or germanium. The first layer of nitride semiconductor material, the nitride interlayer, and the second layer of nitride semiconductor material together have a thickness of at least about 0.5 µm. The nitride semiconductor material may have a second lattice constant, such that the first layer of nitride semiconductor material may be more tensile strained on one side of the substantially relaxed nitride interlayer than the second layer of nitride semiconductor material may be on the other side of the substantially relaxed nitride interlayer.

The second layer of nitride semiconductor material may be compressively strained on one side of the substantially relaxed nitride interlayer and the first layer of nitride semiconductor material may be tensile strained on the other side of the substantially relaxed nitride interlayer.

The semiconductor structure may further include a discontinuous mask layer directly on the substantially relaxed nitride interlayer. The discontinuous mask layer may include SiN and/or MgN. In some embodiments, the discontinuous mask layer may include BN.

The first layer of nitride semiconductor material may have a first dislocation density below the interlayer and the second nitride semiconductor layer may have a second dislocation density lower than the first dislocation density above the interlayer.

The semiconductor structure may include a second discontinuous mask layer directly on the first nitride semiconductor layer, and the nitride interlayer may be on the second discontinuous mask layer.

The nitride interlayer may be doped with silicon at a concentration of about $1 \times 10^{19}$ cm$^{-3}$ to about $1 \times 10^{21}$ cm$^{-3}$. The nitride interlayer may include a graded layer and/or a plurality of sub-layers. The interlayer may include a plurality of InAlGaBN:Si/GaN:Si pairs.

The average strain of the first and second layers of nitride semiconductor material may be less tensile strained than a corresponding semiconductor structure not including the interlayer.

The semiconductor structure may include a substrate, and the layer of nitride semiconductor material may be on the substrate. The layer of semiconductor material may have a first coefficient of thermal expansion and the substrate may have a second coefficient of thermal expansion that may be less than the first coefficient of thermal expansion such that the first layer of nitride material tends to be more tensile strained at room temperature than at an elevated growth temperature.

The second nitride layer may be more relaxed at room temperature than at a growth temperature of the nitride layer. The second nitride layer may be substantially relaxed at room temperature. In some embodiments, the first and second nitride layers may have less bow at a temperature of about 700 to 800° C. than at a growth temperature of the nitride layer.

The interlayer may have a thickness and resistivity such that a voltage drop across the interlayer may be less than about 0.1V at a current density of about 32 A/cm$^2$, which corresponds to a current of about 20 mA passing through an area of about 250 µm×250 µm. The interlayer may have a thickness of about 0.015 µm and a resistivity less than about 2000 ohm-cm.

The nitride interlayer may include a first nitride interlayer having a material composition and a doping concentration, and the structure may further include a second nitride interlayer on the second layer of nitride semiconductor material. The second nitride interlayer may include aluminum and gallium and may be conductively doped with silicon, and the second nitride interlayer may have a material composition and/or doping concentration that is different from the material composition and/or doping concentration of the first nitride interlayer. A third layer of the nitride semiconductor material is on the second nitride interlayer.

The first nitride layer may have a first gallium concentration and the second nitride layer may have a second gallium concentration that is greater than the first gallium concentration.

The first nitride layer may have a first doping concentration and the second nitride layer may have a second doping concentration that is greater than the first doping concentration.

The nitride interlayer may include a plurality of discrete portions therein having a material composition that is different than a material composition of the nitride interlayer. In particular, the nitride interlayer may have a first bandgap and the discrete portions may have a second bandgap that is lower than the first bandgap.

The discrete portions may be present in the nitride interlayer in an amount of between about $0.1/\mu m^2$ and about $100/\mu m^2$, and in some cases may be between about $40/\mu m^2$ and about $60/\mu m^2$, and/or the discrete portions may be between 0.01 μm and 0.1 μm in diameter.

Some embodiments provide methods of forming a semiconductor structure. The methods include forming a first layer of a nitride semiconductor material, forming a substantially relaxed nitride interlayer on the first layer of nitride semiconductor material, and forming a second layer of the nitride semiconductor material. The first layer of nitride semiconductor material, the nitride interlayer, and the second layer of nitride semiconductor material may have a combined thickness of at least about 0.5 μm. The nitride interlayer may have a first lattice constant and may include aluminum and gallium and may be conductively doped with silicon. The nitride semiconductor material may have a second lattice constant such that the first layer of nitride semiconductor material may be less tensile strained on one side of the substantially relaxed nitride interlayer than the second layer of nitride semiconductor material may be on the other side of the substantially relaxed nitride interlayer.

The second layer of nitride semiconductor material may be formed to be compressively strained on one side of the substantially relaxed nitride interlayer and the first layer of nitride semiconductor material may be formed to be tensile strained on the other side of the substantially relaxed nitride interlayer.

The methods may further include forming a discontinuous mask layer directly on the substantially relaxed nitride interlayer before forming the second layer of nitride semiconductor material. The discontinuous mask layer may include SiN and/or MgN. In some embodiments, the discontinuous mask layer may include BN.

The methods may further include forming a second discontinuous mask layer directly on the first nitride semiconductor layer, the nitride interlayer may be formed on the second discontinuous mask layer.

The nitride interlayer may be doped with silicon at a concentration of about $1\times10^{19}$ cm$^{-3}$ to about $1\times10^{21}$ cm$^{-3}$. The nitride interlayer may include a graded layer. The nitride interlayer may include a plurality of sub-layers.

Forming the first layer of nitride semiconductor material may include forming the first layer of nitride semiconductor material on a substrate. The nitride semiconductor material may have a first coefficient of thermal expansion and the substrate may have a second coefficient of thermal expansion that may be less than the first coefficient of thermal expansion such that the second layer of nitride material tends to be more tensile strained at room temperature than at an elevated growth temperature.

The first and second layers of nitride material may have less bow at a temperature in the range of about 700 to about 800° C. than at a growth temperature of the second nitride layer.

The interlayer may have a thickness and resistivity such that a voltage drop across the interlayer may be less than about 0.1V at a current of about 20 mA. The interlayer may have a thickness of about 0.015 μm and a resistivity less than about 2000 ohm-cm.

Forming the nitride interlayer may include forming the nitride interlayer at a temperature of about 800° C. Furthermore, forming the first layer may include forming the first layer to have a thickness of less than about 0.5 μm.

The methods may further include forming a second nitride interlayer on the second layer of nitride semiconductor material. The second nitride interlayer includes aluminum and gallium and is conductively doped with an n-type dopant, such as silicon and/or germanium, and has a second gallium concentration that is greater than the gallium concentration of the first interlayer. A third layer of the nitride semiconductor material is formed on the second nitride interlayer.

The methods may further include etching a layer of the semiconductor structure, wherein the nitride interlayer is used as an etch stop layer.

DETAILED DESCRIPTION OF EMBODIMENTS OF THE INVENTION

Figure 1:
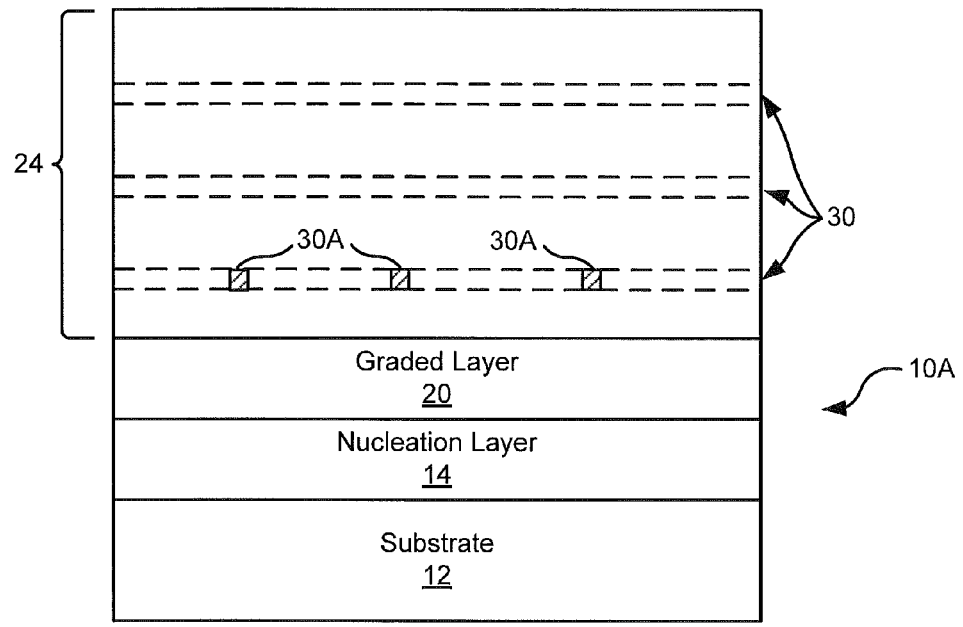
FIG. 1 is a side cross-sectional view of a semiconductor structure according to embodiments of the invention.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout. Furthermore, the various layers and regions illustrated in the figures are illustrated schematically. Accordingly, the present invention is not limited to the relative size and spacing illustrated in the accompanying figures. As will also be appreciated by those of skill in the art, references herein to a layer formed "on" a substrate or other layer may refer to the layer formed directly on the substrate or other layer or on an intervening layer or layers formed on the substrate or other layer.

Embodiments of the present invention can provide a relatively thick, high quality nitride semiconductor structure having a reduced average strain. Thick epitaxial layers of nitride semiconductor material may be particularly suitable for use in conjunction with substrate removal techniques to form substrateless semiconductor devices. Additionally, embodiments of the present invention may provide a nitride semiconductor structure that may be utilized in providing substrates and/or seed crystals for producing semiconductor substrates. The nitride semiconductor structure includes a semiconductor interlayer or layers that act to reduce a build-up of strain in the structure, so that the average strain of the structure is reduced at a desired temperature. For example, the interlayer structure may be designed to minimize average strain in a structure at room temperature or at another important temperature such as the active layer growth temperature.

Embodiments of the present invention are described below with reference to a Group III nitride based semiconductor structure. However, as will be appreciated by those of skill in the art in light of the present disclosure, embodiments of the present invention may be advantageously utilized with other semiconductor materials. As used herein, the term "Group III nitride" refers to those semiconducting compounds formed between nitrogen and the elements in Group III of the periodic table, usually aluminum (Al), gallium (Ga), boron (B) and/or indium (In). The term also refers to ternary and quaternary compounds such as AlGaN and AlInGaN. As is well understood by those in this art, the Group III elements can combine with nitrogen to form binary (e.g., GaN), ternary (e.g., AlGaN, AlInN), and quaternary (e.g., AlInGaN) compounds. These compounds all have empirical formulas in which one mole of nitrogen is combined with a total of one mole of the Group III elements. Accordingly, formulas such as $Al_xGa_{1-x}N$ where $0 \leqq x \leqq 1$ are often used to describe them.

Some embodiments of the present invention are schematically illustrated in the cross-sectional view of FIG. 1. The semiconductor structure 10A in certain embodiments of the present invention includes a substrate 12 that may include, for example, silicon, silicon carbide and/or sapphire.

A nucleation layer 14, such as an aluminum nitride layer, is on the substrate 12 and provides a transition of crystal structure between the substrate and the remainder of the structure. Silicon carbide has a much closer crystal lattice match to Group III nitrides than does sapphire ($Al_2O_3$), which is a very common substrate material for Group III nitride devices, or silicon. The closer lattice match may result in Group III nitride films of higher quality than those generally available on sapphire or silicon. Silicon carbide also has a very high thermal conductivity so that the total output power of Group III nitride devices on silicon carbide is, typically, not as limited by thermal dissipation of the substrate as in the case of the same devices formed on sapphire. Also, the availability of semi-insulating silicon carbide substrates may provide for device isolation and reduced parasitic capacitance. In embodiments in which the substrate 12 is to be removed, a silicon substrate may be appropriate, since large diameter silicon wafers are commonly available and silicon may be easier to remove than silicon carbide or sapphire.

Although some embodiments of the present invention are described herein with reference to silicon or silicon carbide substrates, embodiments of the present invention may utilize any suitable substrate, such as sapphire, aluminum nitride, aluminum gallium nitride, gallium nitride, GaAs, LGO, ZnO, LAO, InP and the like. In some embodiments, appropriate nucleation layers also may be formed on the substrate.

SiC substrates suitable for use in embodiments of the present invention are manufactured by, for example, Cree, Inc., of Durham, N.C., the assignee of the present invention, and methods for producing SiC substrates are described, for example, in U.S. Pat. Nos. Re. 34,861; 4,946,547; 5,200,022; and 6,218,680, the contents of which are incorporated herein by reference in their entirety. Similarly, techniques for epitaxial growth of Group III nitrides have been described in, for example, U.S. Pat. Nos. 5,210,051; 5,393,993; 5,523,589; and 5,292,501, the contents of which are also incorporated herein by reference in their entirety.

In additional embodiments of the present invention, the substrate may be a GaN-based substrate, for example, produced utilizing a epitaxial lateral overgrowth (ELOG) or a pendeo-epitaxial growth technique. Examples of such techniques are described in U.S. Pat. No. 6,051,849 entitled "GALLIUM NITRIDE SEMICONDUCTOR STRUCTURES INCLUDING A LATERAL GALLIUM NITRIDE LAYER THAT EXTENDS FROM AN UNDERLYING GALLIUM NITRIDE LAYER," U.S. patent application Ser. No. 09/525,721, entitled "GALLIUM NITRIDE SEMICONDUCTOR STRUCTURES INCLUDING LATERALLY OFFSET PATTERNED LAYERS" filed Feb. 27, 1988, U.S. Pat. No. 6,265,289 entitled "METHODS OF FABRICATING GALLIUM NITRIDE SEMICONDUCTOR LAYERS BY LATERAL GROWTH FROM SIDEWALLS INTO TRENCHES, AND GALLIUM NITRIDE SEMICONDUCTOR STRUCTURES FABRICATED THEREBY" and U.S. Pat. No. 6,177,688 entitled "PENDEOEPITAXIAL GALLIUM NITRIDE SEMICONDUCTOR LAYERS ON SILICON CARBIDE SUBSTRATES", the disclosures of which are incorporated herein as if set forth in their entirety. Additionally, embodiments of the present invention may be utilized prior to such growth techniques so as to provide a gallium nitride based layer on which subsequent gallium nitride based layers are provided.

Furthermore, strain compensation techniques as described in U.S. Pat. No. 6,841,001 entitled "STRAIN COMPENSATED SEMICONDUCTOR STRUCTURES AND METHODS OF FABRICATING STRAIN COMPENSATED SEMICONDUCTOR STRUCTURES", the disclosure of which is incorporated herein as if set forth in its entirety, may be used in conjunction with some embodiments of the invention.

As noted above, some embodiments of the invention may employ silicon substrates. When a silicon substrate is used, the substrate may be initially heated in an atmosphere of hydrogen and silane ($SiH_4$), or another reactive silicon source, that may both prevent/discourage the formation of SiN on the substrate and also remove any $SiO_2$ from the substrate. As the presence of SiN and/or $SiO_2$ on the substrate may negatively affect the morphology of layers grown on the substrate, it is generally desirable to remove or prevent/discourage the formation of SiN and/or $SiO_2$ on the substrate.

The reactive silicon supplied by the silane may consume any oxygen or nitrogen that may otherwise react with the silicon substrate during heat-up and desorption and form amorphous/polycrystalline $SiO_2$ and/or SiN. The addition of a small silane flow may also prevent or slow etching/decomposition of the silicon substrate. A substantially pristine silicon substrate surface may thereby be preserved, allowing the growth of higher quality III-nitride materials thereon with less tensile (more compressive) strain than may otherwise be possible.

The silane pre-treatment described above may increase yields and/or throughput of a manufacturing process by permitting some residual Group III-nitride deposition from previous runs, or a less pure environment. Moreover, the silane pre-treatment described above may enable the use of some quartz parts within the reactor chamber without adverse effects.

Flowing silane over the silicon substrate may be contrasted with conventional silicon pre-treatment processes in which the silicon substrate is heated in a pure $H_2$ environment to remove residual $SiO_2$ from the substrate. In addition to residual $SiO_2$, hot $H_2$ gas may etch other oxygen or nitrogen containing compounds, such as $SiO_2$ parts and or residual nitride deposits from previous runs. The oxygen and/or nitrogen liberated by the $H_2$ gas may be transported to the substrate, where it may form new deposits. Furthermore, silicon atoms can be removed from the substrate by the $H_2$ gas, which may cause roughening of the silicon surface. Furthermore, an HF etch may be used to remove residual $SiO_2$ from the substrate.

In some embodiments, a small amount of silane is flowed across the silicon substrate to achieve a vapor pressure about equal to the equilibrium vapor pressure over Si at the desorption temperature. For example, at a pressure of 0.2 atmospheres and a temperature of about 1000° C., a ratio of about $10^{-7}$:1 $SiH_4$ to hydrogen carrier gas may be used. Flowing too much silane may result in silicon deposition and, consequently, a rougher surface of the deposited Group III-nitride epitaxial layer. Other sources of silicon such as $Si_2H_6$, $SiCl_4$, $SiBr_4$, $Si_3N_4$, a coating of the reactor parts, or solid silicon placed upstream may be used instead of or in addition to silane.

Referring again to FIG. 1, in order to grow an AlN nucleation layer on a silicon substrate, it may be desirable to initially flow only an aluminum source gas, such as trimethyl aluminum (TMA), and then to flow the nitrogen source gas to form AlN. By initially flowing the aluminum source gas without any nitrogen source gas, the formation of SiN on the silicon substrate may be discouraged, reduced or prevented. The AlN layer may be grown, for example, at a relatively high growth temperature in the range of about 1000° C. to about 1100° C. If the nucleation layer is grown too hot, it may have a poor morphology. The resulting AlN layer on the silicon substrate may encapsulate the silicon substrate to reduce or prevent the reaction of the silicon in the substrate with nitrogen to form SiN in subsequent steps. While SiN may be deposited in subsequent processing steps, it may be formed through reaction of source gases, not by reaction with the silicon substrate.

The AlN layer may also serve as the nucleation layer 14, which provides a template for subsequent growth of nitride semiconductor materials. The nucleation layer may have a thickness of about 0.1 to about 0.6 µm. In some embodiments, the nucleation layer 14 may include a plurality of sublayers.

Still referring to FIG. 1, the semiconductor structure 10 includes a graded layer 20 on the nucleation layer 14. The graded layer 20 may provide a transition from the crystal structure of the nucleation layer 14 to a different crystal structure. For example, while the nucleation layer may include aluminum nitride, it may be desirable to ultimately grow a layer of GaN on the structure. Accordingly, the graded layer 20 may provide a relatively smooth transition from AlN to GaN. For example, the graded layer 20 may be graded from a composition including $Al_xGa_{1-x}N$ at the interface with the nucleation layer 14 to GaN. In some embodiments, the grading may start from x=1 (i.e. from AlN). In other embodiments, the grading may start from an alloy including about 30% GaN (x=0.7).

Figure 1A:
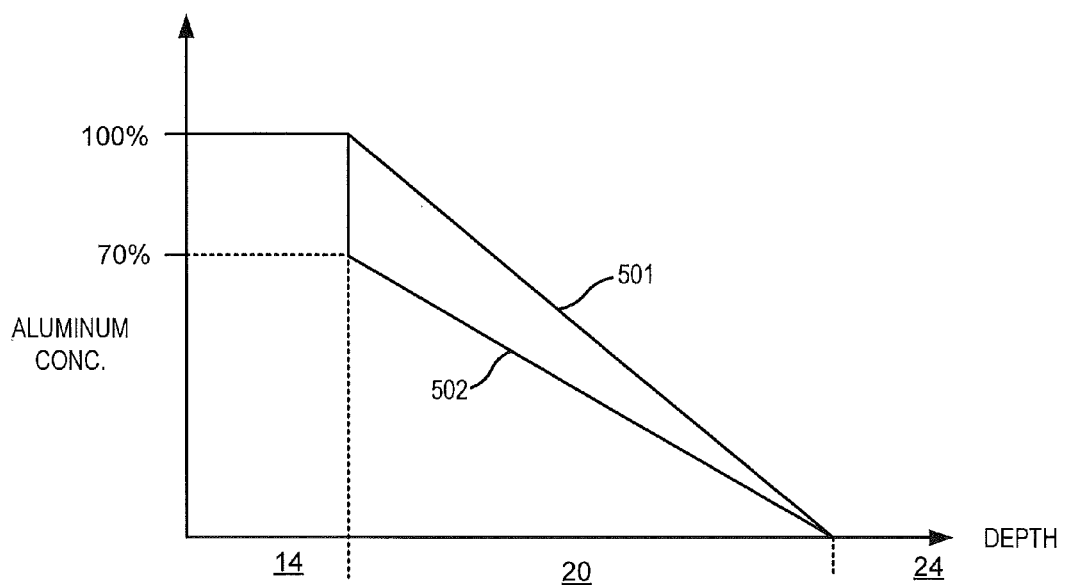
FIG. 1A is a graph of aluminum concentration versus thickness for a graded layer according to embodiments of the invention.

Some possible aluminum profiles are shown in FIG. 1A. As illustrated therein, the aluminum concentration in layer 14 is 100% (x=1). In some embodiments, the aluminum concentration in the graded layer 20 may be graded from 100% to 0%, as indicated by curve 501. In other embodiments, the aluminum concentration may be graded from a lower percentage, such as 70% (x=0.7), down to 0%, as indicated by curve 502.

The starting aluminum composition of the graded layer 20 may affect the strain in the structure. For example, if the grading of the graded layer 20 starts at x=1 (i.e. from AlN), there may be too much compressive strain in the resulting structure at a given temperature, which may cause wafer cracking and/or breakage. Starting the grading at a lower aluminum composition (e.g. x=0.7) may cause the structure to have a more balanced strain. In general, it may be desirable to choose the starting aluminum percentage in the graded layer 20 at a level that will balance strain in the overall structure so that the wafer will have less bow at a given temperature, such as an InGaN growth temperature (in the range of about 700° C. to about 800° C.), while not causing too much tensile stress at room temperature.

Referring to FIG. 1, in some embodiments of the present invention, the semi-insulating AlN nucleation layer 14 is deposited at high temperature (e.g. >1000° C.) on a silicon substrate. Next, a semi-insulating $Al_xGa_{1-x}N$ layer is deposited at high temperature (e.g. >1000 C) on the AlN nucleation layer to provide a graded layer 20. The growth conditions (such as temperature, pressure, V/III ratio, growth rate, thickness, etc.) may be adjusted to provide that the graded layer 20 is not coherently strained to the AlN layer 14. Preferably, the graded layer 20 will initially begin growth in a three-dimensional mode with a relatively low density of nuclei (e.g. $<10^9$ $cm^{-2}$). As would be appreciated by those of skill in the art in light of the present disclosure, the detailed growth conditions may differ depending on reactor geometry and, therefore, may be adjusted accordingly to achieve AlGaN with the desired properties. A nitride layer 24 of GaN and/or $Al_xGa_{1-x}N$ (x≈0.1) may be provided on the graded layer 20. X-ray diffraction crystallography may be used to determine the strained lattice constant of the resulting nitride layer 24. If the resulting nitride layer 24 does not have the desired strained in-plane lattice constant, the composition of the nitride layer 24 and/or the growth conditions may be adjusted so as to provide the desired strained in-plane lattice constant.

In general, when the nucleation layer 14 includes AlN, the nitride layer 24 may start out compressively strained, since the a-plane lattice constant of GaN is larger than the a-plane lattice constant of AlN. (In general, the a-plane lattice constant refers to the lateral distance between atoms in the material for material grown in the (0001) direction.) However, as the nitride layer 24 is grown thicker, it may tend to become more tensile strained.

In order to reduce the overall strain in the structure 10A, one or more substantially relaxed interlayers 30 may be provided within the nitride layer 24. The interlayers 30 have an unstrained lattice constant that is mismatched with the unstrained lattice constant of the nitride layer 24. In particular, the interlayers 30 may have an unstrained lattice constant that is less than the unstrained lattice constant of the nitride layer 24 at the growth temperature. The relaxed interlayer(s) 30 may act as a quasi-ideal substrate layer for subsequent epitaxial growth that resets the initial strain of nitride material grown thereon to be more compressive (less tensile) in nature. As the nitride layer 24 is grown to a large thickness (e.g. about 0.5 µm or greater), the material composition of the layer tends to become more tensile strained at the growth temperature. As the material is cooled to a cooler temperature (such as, for example, room temperature or a cooler material growth temperature), the difference in coefficient of thermal expansion (CTE) between the nitride layer 24 and the substrate 12 may tend to cause the nitride layer 24 to become even more tensile strained, which may ultimately lead to undesirable levels of wafer bow and/or cracking.

However, since the interlayer(s) 30 is grown as a relaxed layer within the nitride layer 24, the portion of the nitride layer 24 grown on the interlayer(s) 30 may be, at least initially, more compressively strained than the portion of the nitride layer 24 immediately beneath the interlayer(s) 30. Thus, the average strain of the overall structure is made more compressive than would be the case in the absence of the interlayer(s) 30. Accordingly, when the structure 10A is cooled to a lower temperature, the structure 10 may have a reduced level of tensile strain, which may reduce wafer bow and/or cracking.

The interlayer(s) 30 may be grown as a relaxed layer by selecting an appropriate material composition, thickness and growth temperature to cause the interlayer(s) 30 not to be pseudomorphically strained to the underlying portion of the nitride layer 24 on which it is grown. For example, the unstrained lattice constant of the interlayer(s) 30 may be sufficiently mismatched with the lattice constant of the nitride layer 24 on which it is formed that the interlayer(s) 30 may tend to crack when it reaches a certain thickness, such as a thickness of about 150 nm. Cracking of the interlayer(s) 30 may release strain in the layer, causing it to become relaxed. In order to have a sufficiently mismatched unstrained lattice constant so as to cause relaxation, the interlayer(s) 30 may include a concentration of aluminum of about 50% or more. Moreover, a growth temperature of about 700° C. to about 800° C. may contribute to relaxation of the interlayer(s) 30.

However, it will be appreciated that the interlayer(s) 30 need not be cracked in order to be relaxed, depending on the growth conditions used to form the interlayer(s) 30. For example, the interlayer(s) 30 could be formed as a relaxed layer with a high density of dislocation defects. In some embodiments, the interlayer(s) 30 or a portion thereof can be crystalline, polycrystalline, amorphous, highly disordered and/or a combination of these to provide a relaxed layer.

It will be understood that in some embodiments, the interlayer(s) 30 may include a plurality of sublayers and/or may include one or more graded layers. The interlayer(s) 30 may include one or more layers of InAlGaBN. Furthermore, SiN and/or MgN layers may be incorporated within the interlayer(s) 30. Small amounts of P or As may be substituted for N in some cases.

Providing at least one interlayer(s) 30 in the nitride layer 24 may improve the surface morphology of the structure 10A. However, the surface morphology of the structure 10A may worsen as more interlayers 30 are included.

In some embodiments, the interlayer(s) 30 may include a plurality of InAlN:Si/GaN:Si pairs or InAlGaN:Si/GaN:Si pairs. Indium (or other materials such as Sn with low incorporation ratios) may be used as surfactants, dislocation motion modifiers and/or point defect modifiers during the formation of the interlayer(s) 30. Furthermore, the interlayer(s) 30 may be alloyed with a material such as InN that has a large lattice mismatch to AlGaN. Such alloying may make the layers more compliant and/or may reduce stress in the layers.

The semiconductor material of the interlayer(s) 30 has structural properties (e.g. similar crystal structure and orientation) similar to the semiconductor material(s) of the subsequently grown epitaxial layers, but has an unstrained lattice constant that is sufficiently mismatched with a lattice constant of the nitride layer 24 such that the portion of the nitride layer 24 formed on the interlayer(s) 30 will at least initially be under compressive strain. In order to put the nitride layer 24 into compressive strain, the interlayer(s) 30 may have an unstrained lattice constant at the growth temperature that is smaller than the unstrained lattice constant of the nitride layer 24 at the growth temperature. In certain embodiments of the present invention, the interlayer(s) 30 may be grown as a substantially unstrained layer at a growth temperature of about 800° C., and strain may be induced in the interlayer(s) 30 when the structure cools from the growth temperature.

In some embodiments of the present invention, the interlayer(s) 30 may comprise a Group III-nitride, such as AlGaN or AlInGaN. However, in other embodiments of the present invention, the interlayer(s) 30 may also include other semiconductor materials, such as SiGe, GaAs or the like. In certain embodiments of the present invention, the interlayer(s) 30 may be conductively doped with dopants, such as Si, Ge and/or Mg. The thickness of the interlayer(s) 30 may vary depending on the particular semiconductor structure. For example, the thickness of the interlayer(s) 30 may be from about 1 nm to about 1 µm for an AlGaN based interlayer(s). The interlayer(s) 30 should not be so thick as to cause cracking and/or substantial defect formation in the thicker layers around the interlayer(s) 30. The interlayer(s) 30 may have a thickness that is large enough to be relaxed but not so large as to cause an undesirably large decrease in vertical conductivity through the structure. Accordingly, in some embodiments, the interlayer(s) 30 may have a thickness in the range of about 10 nm to about 20 nm. In particular embodiments, the interlayer(s) 30 may include AlN with a thickness of about 15 nm.

In some embodiments, the interlayer(s) 30 may include AlGaN with a substantially uniform aluminum concentration. In further embodiments, the interlayer(s) 30 may be an $Al_xGa_{1-x}N$ layer that is graded with composition x decreasing during the growth so that a concentration of aluminum decreases with increasing distance from the substrate. The change in composition may be linear, non-linear and/or step wise. Furthermore, the interlayer(s) 30 may be a short period super lattice of AlN and GaN or AlGaN and AlGaN.

In some embodiments, the interlayer(s) 30 may include boron (B). The presence of boron in the interlayer(s) 30 may reduce the lattice constant of the interlayer(s) 30. However, the concentration of boron in the interlayer(s) 30 may be kept below the concentration that would cause the interlayer(s) to become polycrystalline.

Furthermore, the interlayer(s) 30 may be grown, for example, by adjusting the composition, such as the Al composition, or growth conditions of the interlayer(s) 30, such that the portion of the nitride layer 24 immediately above the interlayer(s) 30 is under compressive strain at growth temperature if the coefficient of thermal expansion ("CTE") of the nitride layer 24 is greater than that of the substrate (e.g. GaN/SiC or GaN/Si) or under tensile strain at the growth temperature if the CTE of the nitride layer 24 is less than that of the substrate (e.g. $GaN/Al_2O_3$) such that the nitride layer 24 may become more nearly relaxed at temperatures lower than the growth temperature. The temperature at which the nitride layer 24 is substantially unstrained may be chosen to be the substrate removal temperature, to facilitate removal of the nitride layer 24 from the substrate in a single piece. Alternatively, the temperature at which the nitride layer 24 is substantially unstrained could be chosen to be the bulk regrowth temperature which may facilitate use of the nitride layer 24 as a seed still attached to the original substrate.

Furthermore, the temperature at which the nitride layer 24 is substantially unstrained could be chosen based on the device operating temperature. The temperature at which the nitride layer 24 is substantially unstrained could also be chosen based on an intermediate temperature such that strain never exceeds a critical value over all temperature ranges the structure will experience over its lifetime. The temperature at which the nitride layer 24 is substantially unstrained could also be chosen based on a process temperature at which an important process step occurs, such as epitaxial growth of an InGaN quantum well that may serve as an active layer of the ultimate device fabricated using the nitride layer 24.

For example, nitride semiconductor materials are commonly used to form light emitting devices including thin (e.g. <50 Å) InGaN quantum well layers that are typically formed at growth temperatures in the range of about 700° C. to about 800° C., which may be less than the typical growth temperature for GaN. The InGaN quantum well layer may be a critical feature of a light emitting device, since the quality and composition of the InGaN quantum well layer may strongly affect the brightness and/or the wavelength of light emitted by the LED. Wafer bow and/or warping may cause the thin InGaN layers to be formed unevenly on the wafer, which may reduce the usable yield of devices from a wafer. Accordingly, it may be desirable to customize the level of strain in the semiconductor structure 10A such that the overall level of strain is reduced as much as practicable at the InGaN growth temperature, and/or so that the wafer has less bow at the InGaN growth temperature.

In other embodiments, it may be desirable to reduce the overall level of strain in the semiconductor structure as much as possible at room temperature in order, for example, to facilitate wafer dicing. In general, it may be difficult to dice (i.e. saw into chips) a wafer that has substantial bowing/warping.

The interlayer(s) 30 may be conductively doped, for example with Si and/or Ge dopants. In general, it may be desirable for the interlayer(s) to be conductive so as to facilitate vertical current conduction within the nitride layer 24. Vertical conduction may be desirable for certain types of electronic devices, such as vertical light emitting diodes. In some cases, it may be desirable for the interlayer(s) to contribute less than about 0.1V to the total forward operating voltage of the resulting device. That is, it may be desirable for the interlayer(s) to have a resistance of less than about 5 ohms. The voltage drop of the interlayer(s) 30 is determined by the resistance (R) of the layer, which is a function of the resistivity (ρ) of the layer according to the following equation:

$$R = \frac{\rho L}{A}$$

where A is the area of the interlayer(s) 30 and L is the thickness of the interlayer(s) 30. Thus, for a device having dimensions of about 250 μm×250 μm operating at about 20 mA, if the interlayer(s) 30 has a thickness of about 0.015 μm, the resistivity of the interlayer(s) 30 may be less than about 2000 ohm-cm.

In addition to providing vertical conduction, doping the interlayer(s) 30 with an n-type dopant, such as silicon and/or germanium, may decrease the lattice constant of the interlayer(s), which may contribute to making the portion of the nitride layer 24 formed on the interlayer(s) 30 initially more compressively strained. Accordingly, it may be desirable to dope the interlayer(s) 30 with silicon at a concentration in the range of about $1×10^{18}$ cm$^{-3}$ to about $1×10^{21}$ cm$^{-3}$. In order to obtain higher levels of electron density at the device operating temperature, it may be desirable for the interlayer(s) 30 to include in the range of about 10% to about 90% gallium.

In some embodiments, the interlayer(s) 30 may include discrete portions 30A therein that may increase the conductivity of the interlayer(s) 30. The discrete portions 30A may include, for example, discontinuous islands ("dots") of a material such as GaN and/or InGaN that has a lower bandgap than the bandgap of the material that forms the interlayer(s) 30, and/or that may have a higher electron density than the material of the interlayer(s) 30. The use of discrete crystal portions for vertical conductivity is described in greater detail in U.S. Pat. No. 6,187,606 to Edmond et al. entitled "Group III nitride photonic devices on silicon carbide substrates with conductive buffer interlayer structure", the disclosure of which is hereby incorporated herein by reference. In some embodiments, the discrete portions 30A can be crystalline, polycrystalline, amorphous, highly disordered and/or a combination of these.

In some embodiments, the discrete portions 30A may be present in an amount sufficient to increase the vertical conductivity of the interlayer(s) 30, but less than an amount that would detrimentally affect the strain-reducing effects of the interlayer(s) 30 and/or the crystal quality of the nitride layer 24. In some embodiments, the discrete portions 30A may be present in an amount of between about 0.1/μm$^2$ and about 100/μm$^2$, and in some cases may be between about 40/μm$^2$ and about 60/μm$^2$.

Additionally, the sizes of the discrete portions 30A may be large enough to increase the vertical conductivity of the interlayer(s) 30, but smaller than a size that would detrimentally affect the strain-reducing effects of the interlayer(s) 30 and/or the crystal quality of the nitride layer 24. In some embodiments, the discrete portions 30A may be between 0.01 and 0.1 μm in diameter.

In some embodiments, the interlayer(s) 30 may be used as an etch stop layer, for example, for etch-removal of the substrate. Thus, it may be desirable for an interlayer(s) 30 to have an etch selectivity with respect to the nitride layer 24 in which it is formed. For example, An Al-containing interlayer(s) 30, such as AlN, AlGaN, or AlInGaN may be used as an etch stop layer within a GaN or InGaN nitride layer 24. For example, when dry etching an aluminum-containing layer using a fluorine-based chemistry under appropriate conditions, AlF$_3$ may form and block further etching.

Figure 2:
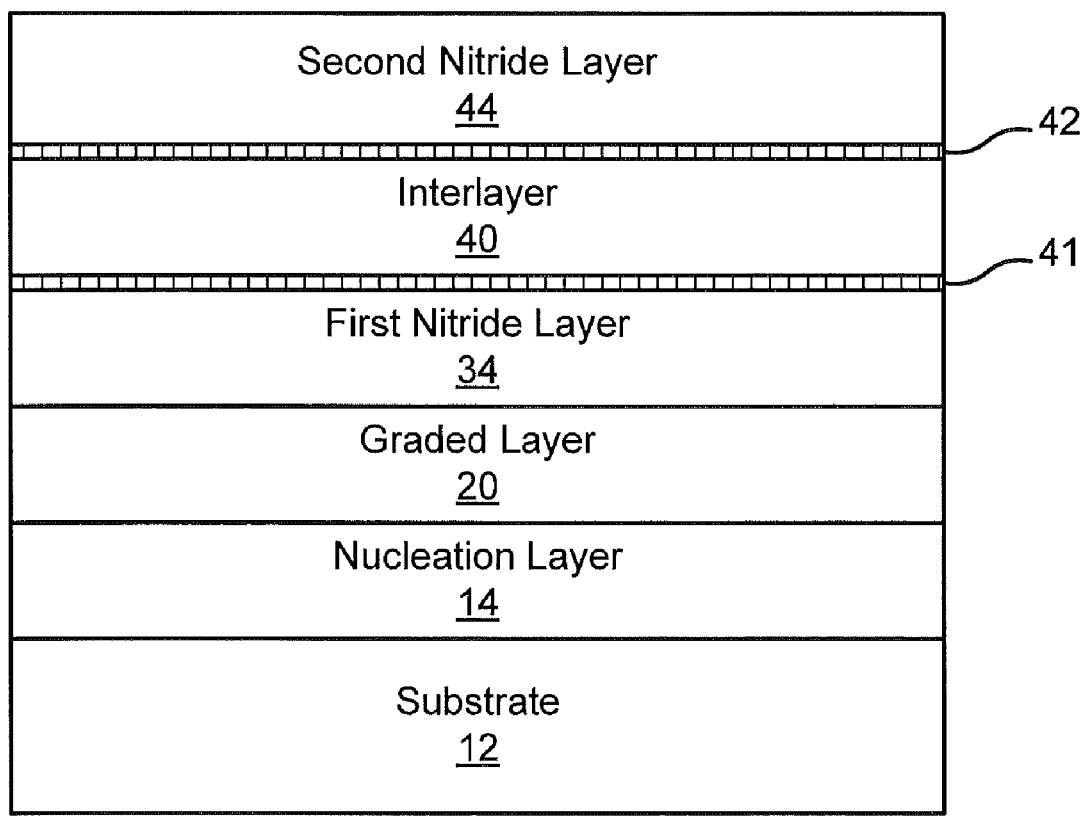
FIG. 2 is a side cross-sectional view of a semiconductor structure according to further embodiments of the invention.

Further embodiments of the invention are illustrated in FIG. 2, in which a semiconductor structure 10B is shown. The semiconductor structure 10B includes a substrate 12, a nucleation layer 14 and a graded layer 20 as described above with reference to FIG. 1. The semiconductor structure 10B further includes a first nitride layer 34 on the graded layer 20. The first nitride layer 34 may include GaN. In general, when the first nitride layer 34 is grown, it may start out compressively strained, since the a-plane lattice constant of GaN is larger than the a-plane lattice constant of AlN. However, as the first nitride layer 34 is grown thicker, it may tend to become more tensile strained. In order to reset the strain in the structure to reduce the overall level of tensile strain, a substantially unstrained interlayer 40 may be formed on the first nitride layer 34. The interlayer 40 may be similar to the interlayer(s) 30 described above with respect to FIG. 1.

Before formation of the interlayer 40, a first optional discontinuous masking layer 41 may be grown on the first nitride layer 34. The first discontinuous masking layer 41 may include SiN, MgN, and/or BN, and be grown at a temperature of about 900° C. The first discontinuous masking layer 41 can be deposited in situ or ex situ, and over a temperature range of about 20° C. to about 1100° C. The temperature should be low enough to help control (and in particular slow) the growth rate and thus control the quality and thickness of the discontinuous layer 41. Temperatures of about 700° C. may be used.

Similarly, a second optional discontinuous masking layer 42 may be formed on the interlayer 40. The second discontinuous masking layer 42 may include SiN, MgN, and/or BN, and be grown at a temperature of about 900° C. The second discontinuous masking layer 42 can be deposited in situ or ex situ, and over a temperature range of about 20° C. to about 1100° C.

Following the growth of the interlayer 40 and the optional first and second discontinuous masking layers 41, 42, a second nitride layer 44 is grown. In embodiments including the first and/or second discontinuous masking layer(s) 42, the material of the second nitride layer 44 may first grow on the surface of the interlayer 40, but not on the mask layer 42. As upward growth from the interlayer 40 may proceed adjacent the discontinuous mask layer portions, after which the nitride material may grow laterally across the mask layer portions. Because defects tend to propagate more easily vertically than horizontally, some defects in the growing nitride material may be blocked by the mask layer 42, which may reduce the defect density of the second nitride layer 44.

The second nitride layer 44 may be grown initially at a temperature that encourages faster lateral growth and thus facilitates defect reduction. For example, the growth of the second nitride layer 44 may be initiated at a temperature of about 1090° C. After the second nitride layer 44 has coalesced over the discontinuous mask layer portions, the growth temperature may be adjusted to encourage vertical growth.

Figure 3:
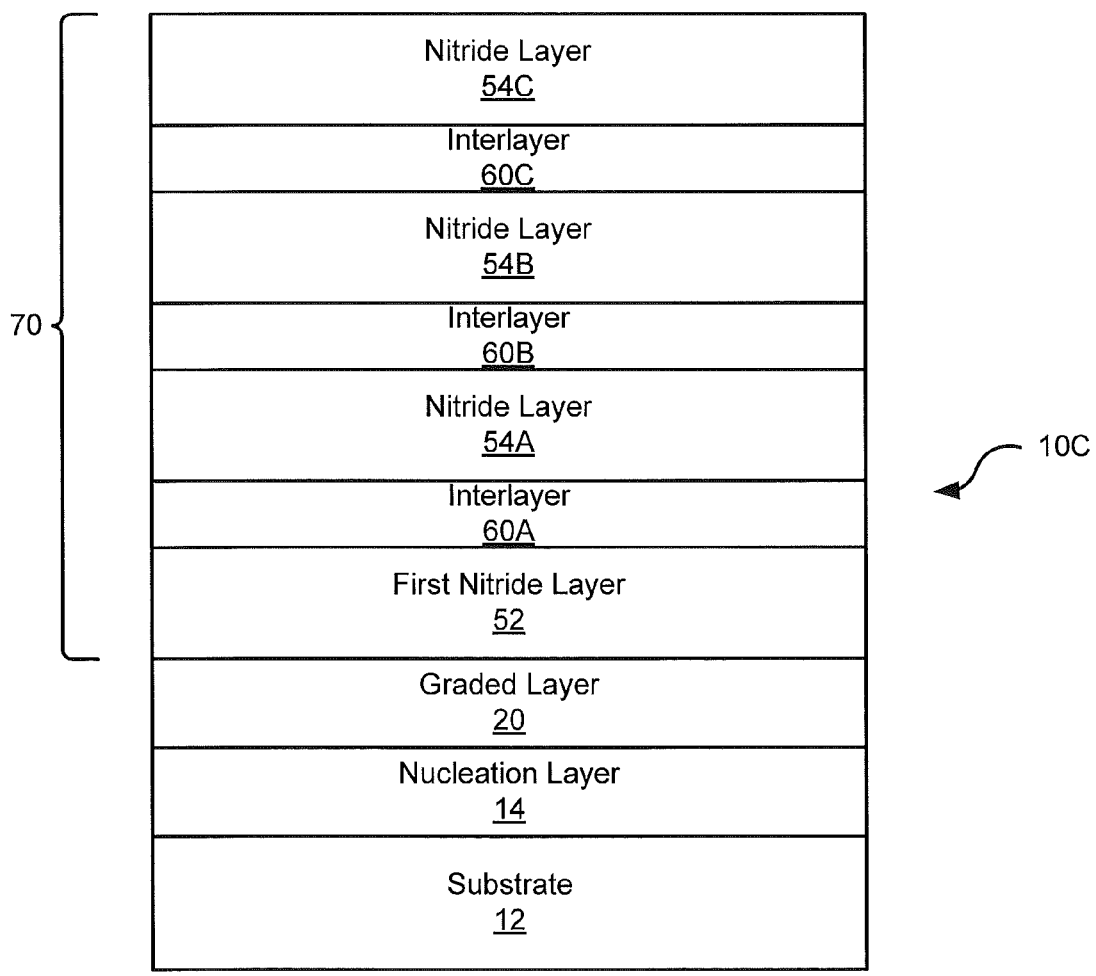
FIG. 3 is a side cross-sectional view of a semiconductor structure according to further embodiments of the invention.

Referring to FIG. 3, a structure 10C including a thick nitride layer 70 is shown. In particular, a thick nitride layer 70 may be grown on a 1 mm thick, 3 inch diameter (111) silicon substrate 12. In general, the substrate 12 may be thicker for higher diameters. The substrate 12 may include a substrate formed by a float-zone (FZ) or a Czochralski (CZ) process. A 0.1 μm thick AlN nucleation layer 14 is provided on the substrate 12, and a 1.7 μm thick graded layer 20 is formed on the nucleation layer 14. In some embodiments, the total thickness of the nucleation layer 14 and the graded layer 20 may be maintained greater than about 1 μm to reduce the occurrence of "volcanoes" which refers to regions where perforations in the III-Nitride layer allowed the underlying Si substrate to be exposed and attacked, potentially resulting in the formation of a cavity in the Si substrate (i.e., the Si "erupts" through the III-Nitride layers).

The curvature of the wafer may be affected by the temperature distribution within the growth reactor. For example, it may be desirable to start the growth of the nucleation layer 14 with a warmer ceiling, which may lead to a flatter wafer during growth of the nucleation layer.

In some embodiments, the graded layer 20 may be continuously graded from AlN to GaN. In other embodiments, the graded layer 20 may be graded from AlGaN to GaN. For example, the graded layer 20 may be graded from $Al_{0.7}Ga_{0.3}N$ at the interface with the nucleation layer 14 to GaN. The composition of the graded layer 20 may affect the total strain in the overall structure. Accordingly, the composition of the graded layer 20 may be selected in view of the material composition of the subsequent layers of the structure 10C.

An alternating stack of nitride layers 52, 54A-C and interlayers 60A-C is formed on the graded layer 20. In particular, a first nitride layer 52 having a thickness of about 0.6 μm is formed on the graded layer 20, and then an alternating stack of interlayers 60A-C and nitride layers 54A-C is formed on the first nitride layer 52. The first nitride layer 52 and/or the nitride layers 54A-C may include GaN.

Each of the interlayers 60A-C may have a thickness of about 15 nm, while each of the nitride layers 54A-C may have a thickness of about 0.5 μm. In some embodiments, a total of 16 interlayer/nitride layer pairs may be formed, for a total thickness of about 8 μm. The nitride layers 54A-C are conductively doped with silicon at a dopant concentration of about $4 \times 10^{18}$ cm$^{-3}$, and the interlayers 60A-C are conductively doped with silicon at a dopant concentration of about $1 \times 10^{19}$ cm$^{-3}$ to about $1 \times 10^{21}$ cm$^{-3}$.

Each nitride layer 54 of the structure 10C starts out compressively strained. However, as each nitride layer 54 grows, it may become more tensile strained. In order to reduce the overall strain of the structure and/or make the overall strain of the structure 10C less tensile, a plurality of substantially relaxed interlayers 60A-C are periodically formed between the nitride layers 54A-C to reset the strain level in the structure 10C. That is, after each substantially relaxed interlayer 60A-C is formed, the next nitride layer 54A-C grown on the interlayer 60A-C starts out being compressively strained (or less tensile strained) than the material immediately beneath the interlayer 60. Thus, when the overall semiconductor structure 10C is formed, it may have a less tensile overall strain than a corresponding structure that does not include the interlayers 60A-C.

In order to increase the vertical conductivity in the upper portions of the structure 10C or for other purposes, such as strain modification, the material composition, doping, and/or other properties of the interlayers 60A-C may vary from layer to layer. For example, in some embodiments, an interlayer 60A-C near the bottom of the structure 10C (i.e. near the first GaN layer 52 or the substrate 12) may have a first gallium concentration, while an interlayer 60A-C near the top of the structure (i.e. opposite the substrate 12) may have a second gallium concentration that is more than the first gallium concentration. In some embodiments, the first interlayer 60A may have a gallium concentration of about 20%, while the third interlayer 60C may have a gallium concentration of about 50%.

The gallium concentration of the interlayers 60A-C may affect the strain in the structure as well as the vertical conductivity of the interlayer. For example, an interlayer with a greater concentration of gallium may make the overall structure more tensile strained, but may provide better vertical conductivity. On the other hand an interlayer 60A-C with a lower concentration of gallium may have lower vertical conductivity but may cause the overall structure to be less tensile strained. In general, it may be desirable to provide greater vertical conductivity near the top of the structure, since that is the portion of the structure in which a device, such as an LED and/or a laser diode may be formed.

Similarly, in some embodiments, it may be desirable to provide a higher doping concentration in interlayers 60A-C near the top of the structure.

Accordingly, in some embodiments, the concentration of gallium in an interlayer 60A-C may increase as the distance of the interlayer 60A-C from the substrate 12 increases.

In some embodiments, a 4 μm thick GaN layer may be grown as the nitride layer 70 with less than 10 μm of wafer bow. Furthermore, a fast growth rate of about 12 μm per hour may be achieved for the thick nitride layer.

In further embodiments of the present invention, the substrate 12 may be removed from a thick nitride layer 70 that has a reduced, or less tensile, overall strain. Substrate removal techniques, including grinding and/or etching, are generally known in the art. Such embodiments may, for example, be suitable for use as seed crystals in growing additional semiconductor structures. These freestanding low strain layers could be used as seed crystals for growth of thicker bulk crystal boules, which could in turn be sliced into wafers and used as substrates for growth of devices. For example, such semiconductor structures may be utilized to provide a GaN layer for fabrication utilizing ELOG and/or pendeo-epitaxial fabrication techniques.

In forming structures as described above, a number of growth parameters may affect the strain in the device. For example, the thickness of the graded layer 20 may affect strain. Making a thinner graded layer 20 may lead to increased cracking of the resulting nitride layer 70. The temperature of growth of the nitride layers 54 may also affect strain in the device. The strain near the top of the structure may be a function of the thickness of the individual nitride layers 54, as well as the growth temperatures of the interlayers 60 and the nitride layers 54. In general, a lower initial growth temperature may lead to improved morphology.

Figure 4:
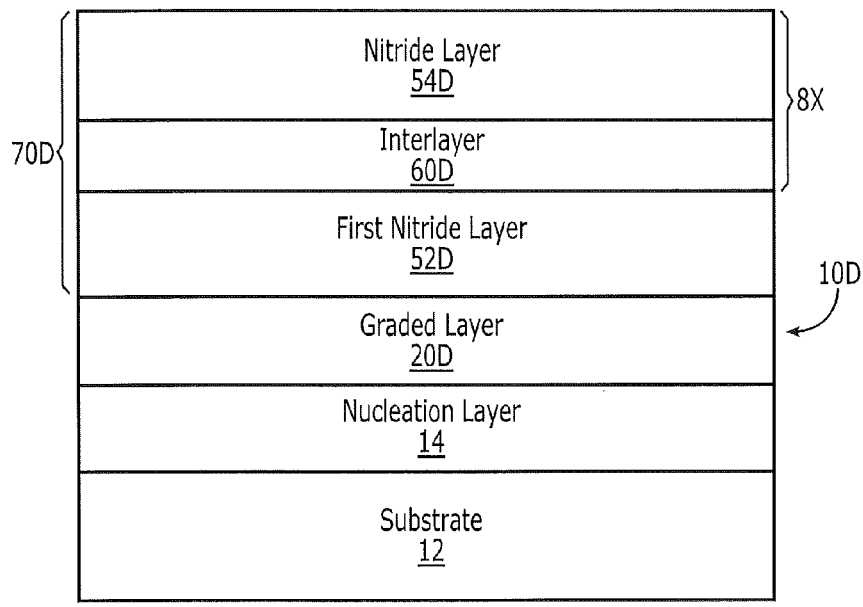
FIG. 4 is a side cross-sectional view of a semiconductor structure according to further embodiments of the invention.

Referring to FIG. 4, a structure 10D including a thick nitride layer 70D is shown. In particular, a thick nitride layer 70D may be grown on a 1 mm thick, 3 inch diameter (111) silicon substrate 12. A 0.4 μm thick AlN nucleation layer 14 is formed on the substrate 12 as described above, and a 1 to 1.5 μm thick graded $Al_xGa_{1-x}N$ layer 20D is formed on the nucleation layer 14. The thickness and/or grading rate of the graded layer 20D may affect the ability of the structure 10D to withstand cracking. For example, reducing the grade thickness by a factor of 3 may lead to cracking. However, increasing the grade thickness beyond about 1.7 μm may not be effective to reduce cracking that may otherwise occur.

The graded $Al_xGa_{1-x}N$ layer 20D may have a composition that is graded from a relatively high concentration of aluminum, e.g. about 75%. Thus, in some embodiments, a graded layer 20D may start with $Al_{0.75}Ga_{0.25}N$ at the interface with the AlN nucleation layer 14, and may be graded to a composition of $Al_{0.2}Ga_{0.8}N$. Reducing the starting aluminum concentration of the graded layer to, for example, 33% may lead to cracking. Furthermore, reducing the starting aluminum concentration to 67% may lead to poor morphology.

An alternating stack of nitride layers 54D and interlayers 60D is formed on the graded layer 20D. In particular, a first GaN layer 52D having a thickness of about 0.4 μm is formed on the graded layer 120, and then an interlayer 60D and a nitride layer 54D are formed on the first GaN layer 52D. The interlayer 60D may have a thickness of about 15 nm and may be grown at a temperature of about 800° C., while the nitride layer 54D may have a thickness of about 0.5 μm. The GaN layers may be grown at a relatively high growth rate of, for example, about 12 μm/hr. The stack including the interlayer 60D and the nitride layer 54D may be repeated, for example, eight times to form a structure having a total thickness in excess of about 4 μm without cracking. The interlayers 60D may be doped with silicon at a concentration of about $2\times10^{19}$ $cm^{-3}$, and the nitride layers 54D may be doped with silicon at a concentration of about $4\times10^{18}$ $cm^{-3}$.

In some embodiments, the stack including the interlayer 60D and the 0.5 μm thick nitride layer 54D may be repeated, for example, 16 times to form a structure having a total thickness in excess of about 8 μm without cracking.

Cracking may also be reduced by eliminating a temperature overshoot at high pressure before the start of epitaxial growth.

The thickness of the interlayers 60 may also affect cracking of the resulting structure. For example, forming 20 nm interlayers 60 may result in an epiwafer having negative (compressive) bow with a crack free center, while forming 10 nm interlayers may result in an epiwafer having a positive (tensile) bow with a crack free center.

Forming an additional GaN layer at higher temperature (e.g. +40° C.) on top of the uppermost nitride layer 54D may lead to cracking.

Various growth and/or structural parameters of a semiconductor structure as described above may affect the resulting strain of the uppermost nitride layer. For example, the total thickness of the nitride layers 70, the period of the interlayer 60/nitride layer 54 pairs, the growth temperature of the nitride layers 54 and the growth temperature of the interlayer 60 may have an effect on the resulting strain in the structure.

In general, the curvature of the resulting epiwafer (which is a result of strain in the epiwafer) may be a strong function of the total thickness of the structure and of the growth temperature of the nitride layers 54.

The strain at the top of the epilayer may be a strong function of the period between interlayers, the growth temperature of the interlayers 60, and the growth temperature of the nitride layers 54.

In particular, increasing the growth temperature of the interlayer (e.g. from 700° C. to 800° C.) may cause the uppermost nitride layer of the structure to be more tensile, while increasing the growth temperature of the nitride layers 54 (e.g. from 965° C. to 985° C.) may cause the uppermost nitride layer of the structure to be more compressively strained. Furthermore, increasing the period of the interlayer 60/nitride layer 54 pairs from 0.5 μm to 1 μm may cause the uppermost nitride layer of the structure to be more tensile strained.

The dislocation density in the nitride layers 54 may be measured, for example, by atomic force microscopy (AFM). According to AFM, increasing the thickness of the nitride layers 54 may decrease the dislocation density, while increasing the growth temperature of the interlayer (e.g. from 700° C. to 800° C.) may increase the dislocation density. Dislocation defects may be measured, for example by performing AFM on a wafer sample and counting the number of defects in a predetermined area of the wafer.

The PL intensity of the material may also be affected by various growth and/or structural properties. For example, increasing the total thickness of the nitride layer 70 and/or increasing the thickness of the nitride layers 54 may increase the blue PL intensity of the material, while increasing the growth temperature of the nitride layers 54 and/or the interlayers 60 may decrease the blue PL intensity. In general, the blue PL intensity indicates structural defects in the material. Thus, it is generally desirable to reduce the blue PL intensity peak.

In contrast, it is generally desirable for nitride material to have a strong band-to-band (GaN) PL emission. The band-to-band PL emission may be most strongly affected by the growth temperature of the interlayers 60. In particular, increasing the interlayer growth temperature may decrease the band-to-band PL emission of the material.

Figure 5:
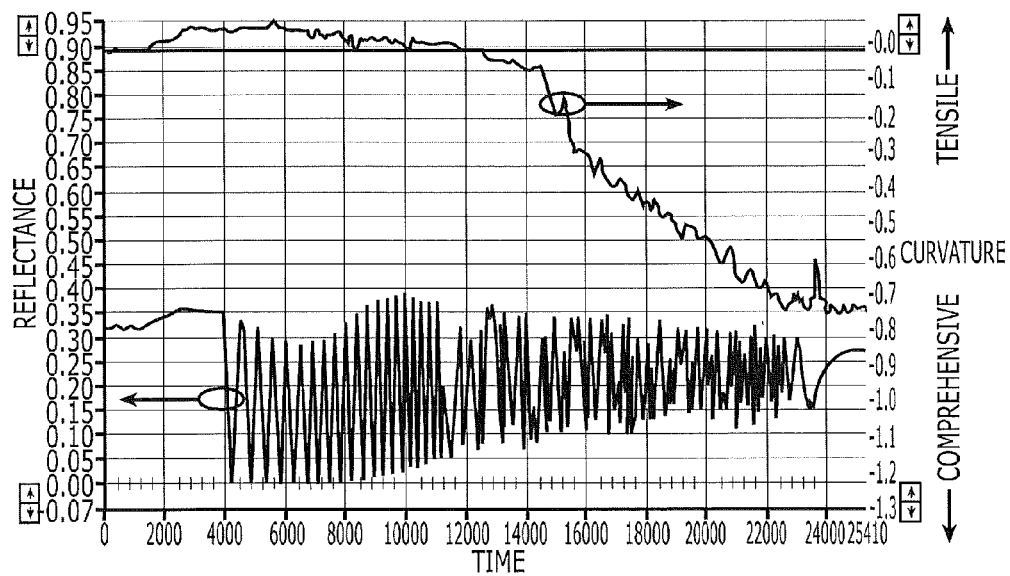
FIG. 5 is a graph of curvature and reflectance for a structure according to embodiments of the invention.

FIG. 5 is a graph of curvature of a structure similar to the structure illustrated in FIG. 4, except that the nucleation layer was 0.1 μm thick, the first GaN layer 52D was 0.6 μm thick, and the interlayer 60D and the nitride layer 54D were repeated sixteen times to form a structure having a total thickness in excess of about 8 μm. In particular, FIG. 5 includes plots of wafer curvature and reflectance versus growth time that were obtained in situ during the growth of GaN on silicon. In FIG. 5, curvature is measured on the rightmost vertical axis, while reflectance is measured on the leftmost vertical axis. Curvature that is more negative indicates that the material is under compressive stress, while curvature that is more positive indicates tensile stress. As shown in FIG. 5, the structure exhibited substantial compressive stress.

Figure 6A:
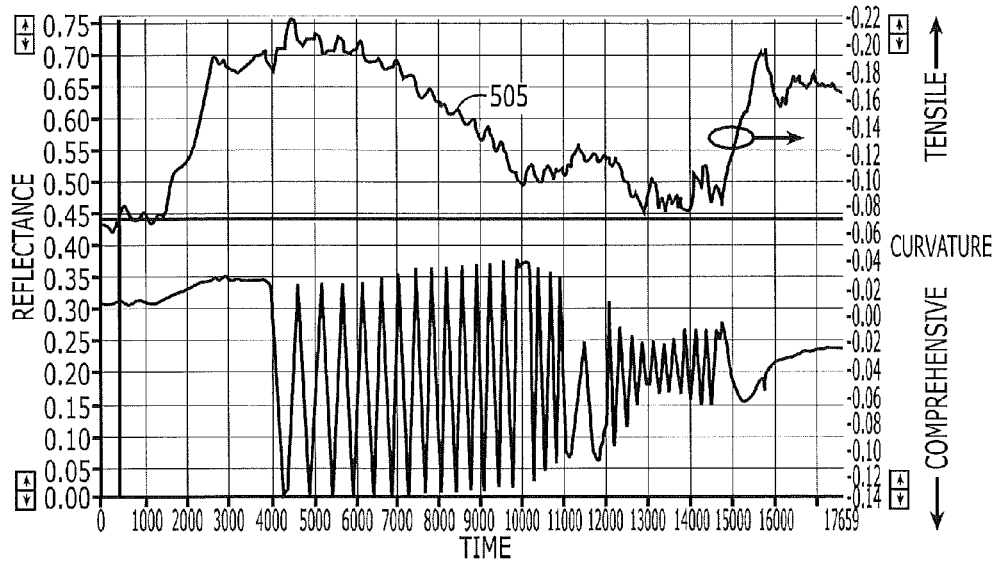
FIGS. 6A and 6B are graphs of curvature and reflectance for structures according to embodiments of the invention.
Figure 6B:
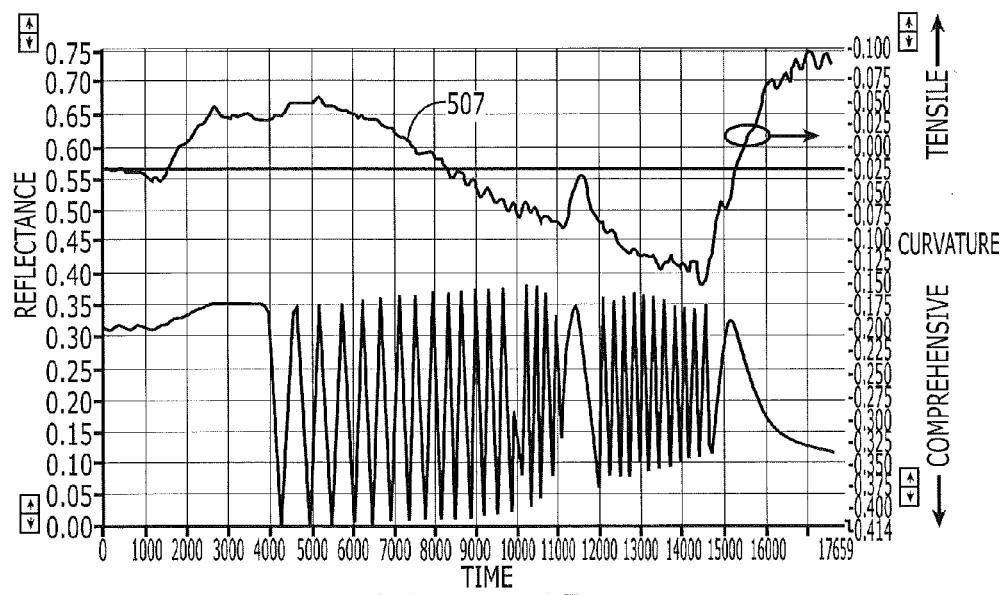

As noted above, flowing silane may encourage the growth of more compressive layers than may otherwise be possible. For example, FIGS. 6A and 6B show the effect on wafer curvature of growing nitride layers with and without silane pretreatment. Curve 505 of FIG. 6A represents the curvature of a wafer grown without a silane preflow. As shown in FIG. 6A, the stress in the wafer without a silane preflow tends to be highly tensile. On the other hand, curve 507 of FIG. 6B represents the curvature of a wafer grown with a 1× silane preflow (i.e. with a ratio of about $10^{-7}:1$ $SiH_4$ to hydrogen carrier gas). As is apparent from FIG. 6B, the stress in the wafer with the silane preflow was less tensile strained after growth, and in fact was compressively strained over a significant portion of the growth process.

Figure 7A:
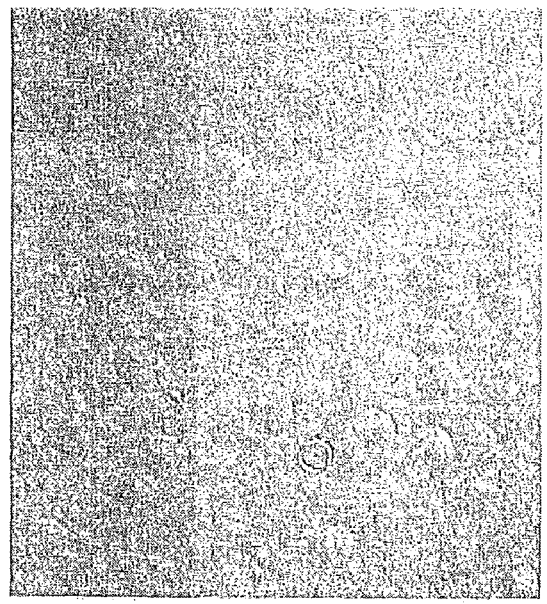
FIGS. 7A and 7B are photographs illustrating surface morphologies of nitride layers according to embodiments of the invention.
Figure 7B:
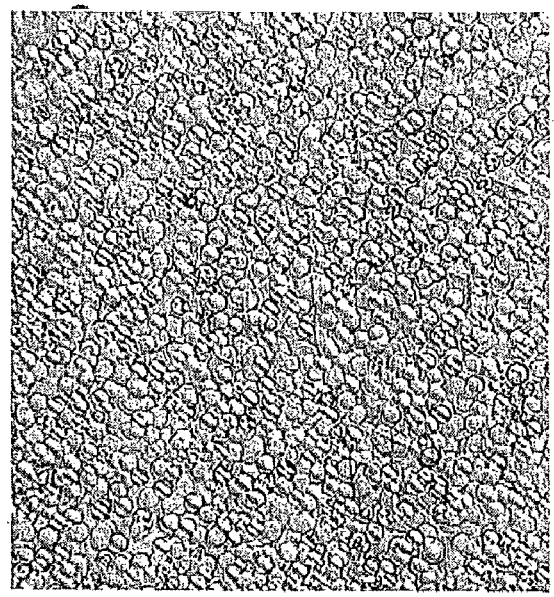

However, flowing too much silane may result in poor morphology of the resulting structure. For example, a 1× silane flow may result in a smooth surface morphology, as shown in FIG. 7A, while a 20× flow may result in an uneven surface, as shown in FIG. 7B.

Figure 8A:
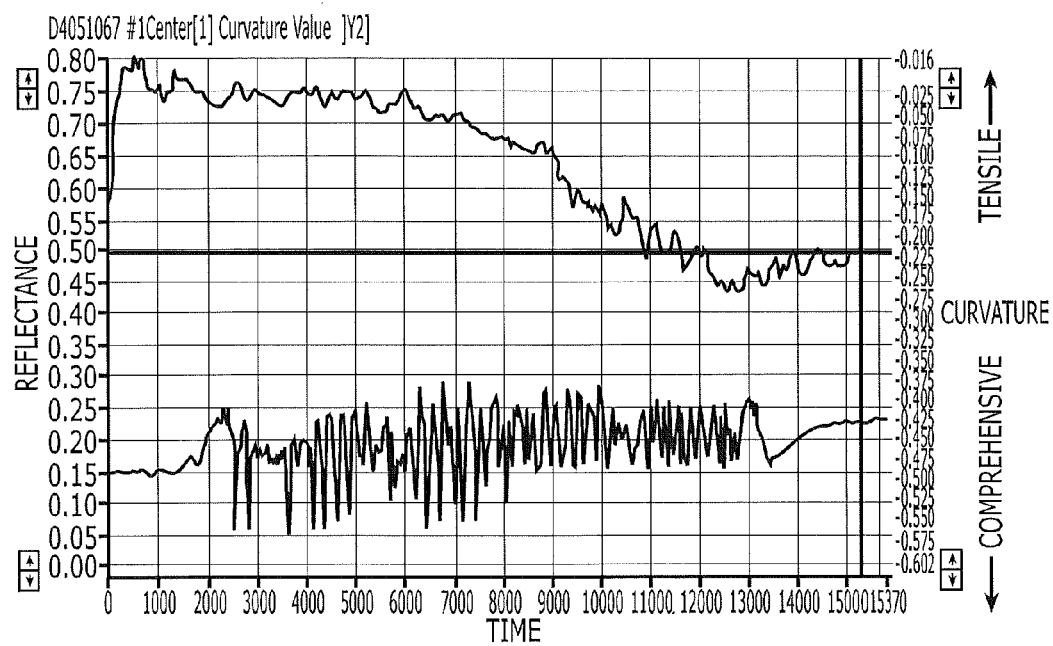
FIGS. 8A and 8B are graphs of curvature and reflectance for structures according to embodiments of the invention.
Figure 8B:
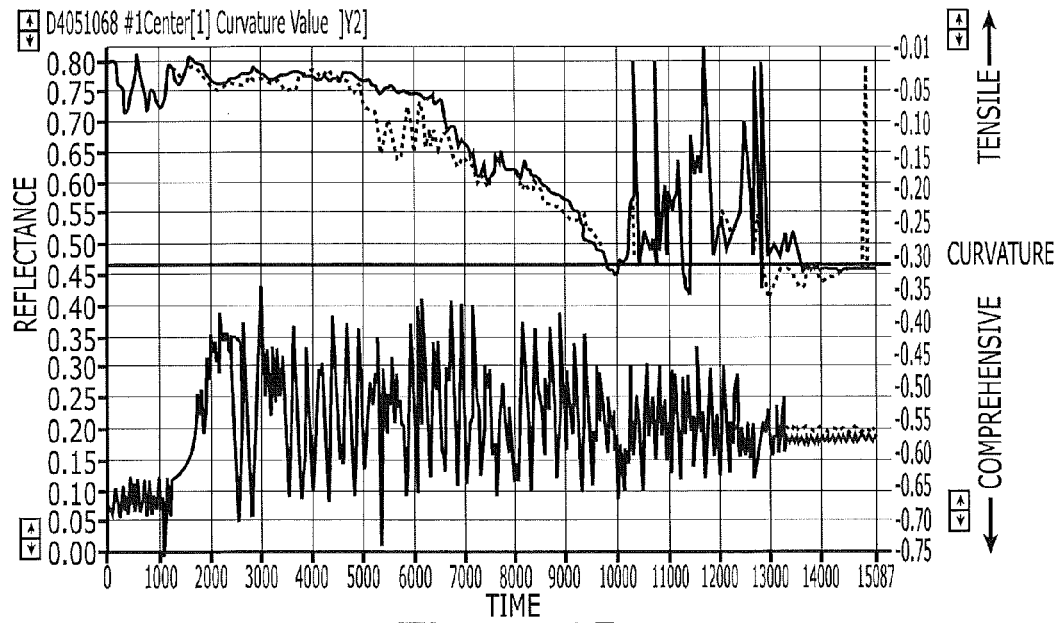

FIGS. 8A and 8B illustrate the effect on strain of changes in growth temperatures. In particular, FIGS. 8A and 8B are graphs of curvature of a structure similar to the structure illustrated in FIG. 4, except that the interlayer 60D and the nitride layer 54D were repeated four times with a 1 μm period to form a structure having a total thickness of about 4 μm. For the structure corresponding to FIG. 8A, the AlN nucleation layer 114 was grown at a temperature of about 700° C., while the nitride layers 54D were grown at a temperature of about 955° C. For the structure corresponding to FIG. 8B, the AlN interlayer 60D was grown at a temperature of about 800° C., while the nitride layers 54D were grown at a temperature of about 985° C. As shown in FIGS. 8A and 8B, the structure corresponding to FIG. 8A in which the layers were grown at lower temperature were slightly less compressively strained.

Figure 9A:
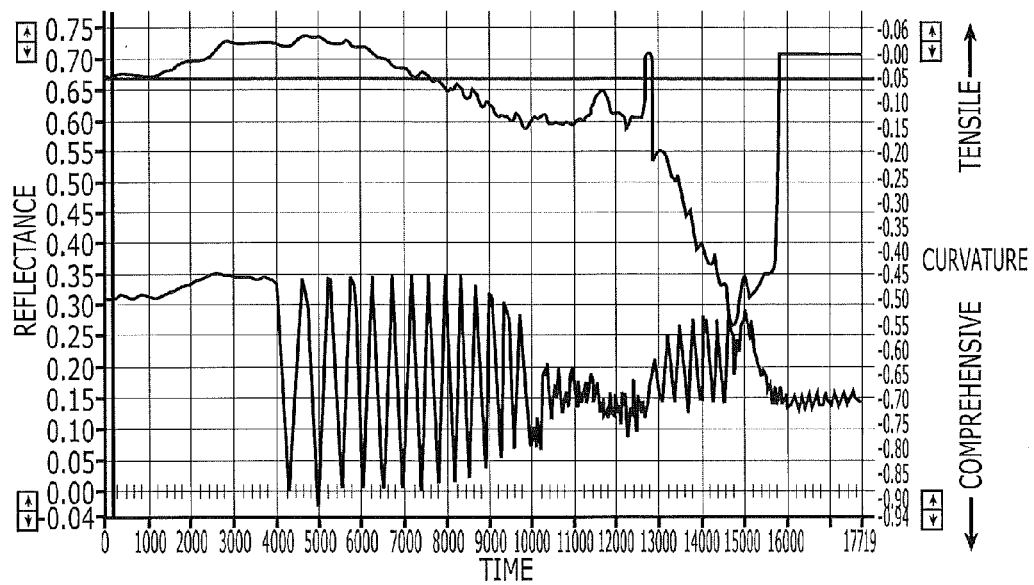
FIGS. 9A and 9B are graphs of curvature and reflectance for structures according to embodiments of the invention.
Figure 9B:
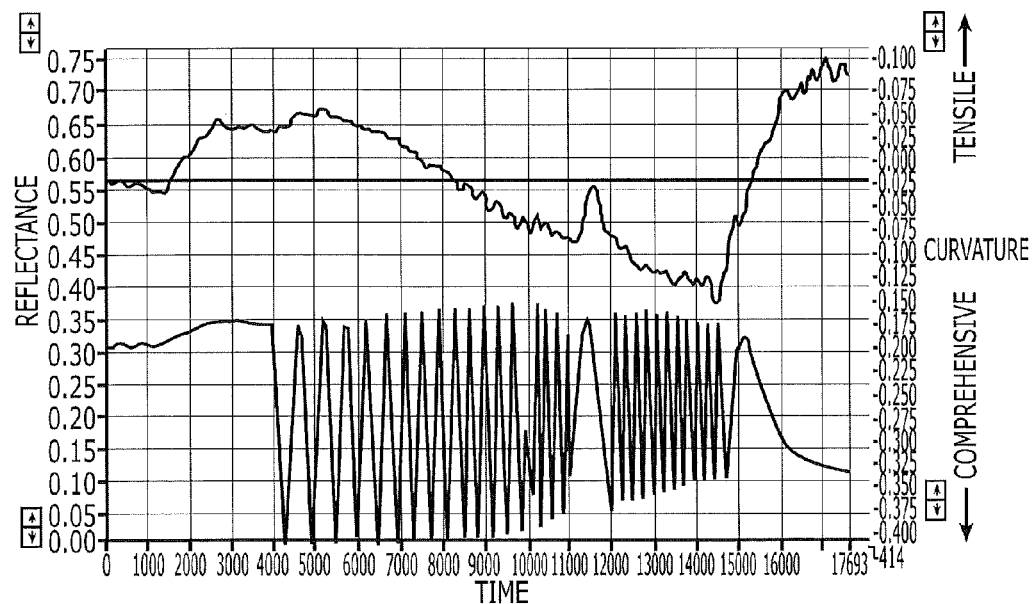

FIGS. 9A and 9B illustrate the effect on strain of changes in interlayer thickness. In particular, FIGS. 9A and 9B are graphs of curvature of a structure similar to the structure illustrated in FIG. 4, except that in the structure corresponding to FIG. 9A, the interlayers 60D were 20 nm thick, while in the structure corresponding to FIG. 9B, the interlayers 60D were 10 nm thick. As shown in FIGS. 9A and 9B, the structure corresponding to FIG. 9A in which the interlayers were 20 nm thick exhibited strong negative curvature indicating large compressive strain, while the strain in the structure corresponding to FIG. 9B in which the interlayers were 10 nm thick were less curved and had lower maximum strain during growth.

Figure 10A:
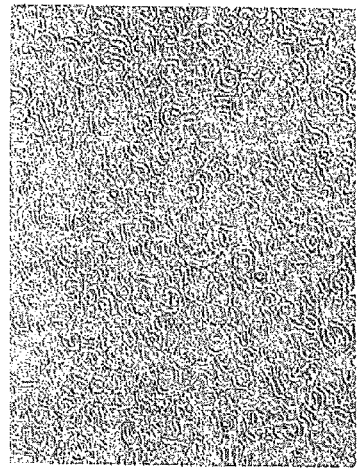
FIGS. 10A, 10B and 10C are photographs illustrating surface morphology of nitride layers according to embodiments of the invention.
Figure 10B:
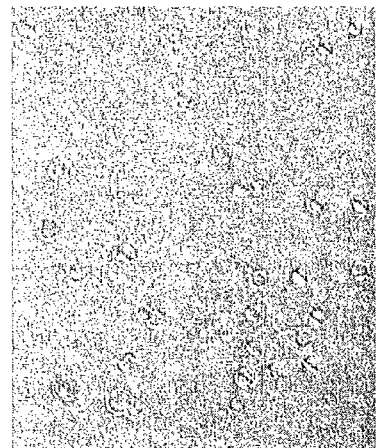
Figure 10C:
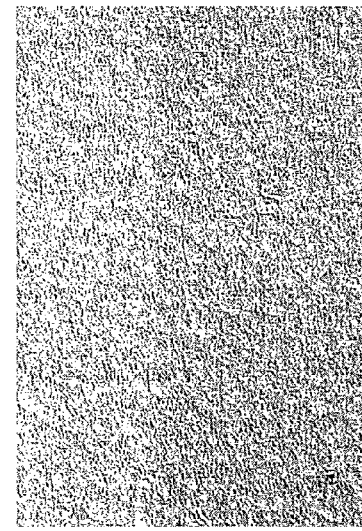

FIGS. 10A-10C illustrate the effect of the presence of interlayers on the morphology of the structure. FIGS. 10A to 10C are Nomarski photographs of structures similar to the structure illustrated in FIG. 1, except that in the structure corresponding to FIG. 10A, no interlayer was included, while in the structure corresponding to FIG. 10B, a single interlayer 60 was included in a 2 μm thick GaN layer 24, and in the structure corresponding to FIG. 10C, three interlayers 60 were included in a 2 μm thick GaN layer 24. As illustrated in FIGS. 10A to 10C, the presence of a single interlayer 60 made the surface of the structure smoother, but the presence of three interlayers 60 starts to make the surface more rough.

While curvature graphs such as those in FIGS. 5, 6A, 6B, 8A, 8B, 9A and 9B can be helpful in understanding stress in epi-wafers grown according to some embodiments of the invention, it is understood by those skilled in the art that causes such as random wafer cracking, non-specular surface morphology, and/or asymmetric wafer warp can produce anomalous or unexpected effects in curvature graphs, and that wafers grown under identical conditions can produce different and/or unexpected results. Thus, the curvature graphs presented herein are provided for illustrative purposes only.

In the drawings and specification, there have been disclosed typical embodiments of the invention, and, although specific terms have been employed, they have been used in a generic and descriptive sense only and not for purposes of limitation, the scope of the invention being set forth in the following claims.

That which is claimed is:

1. A method of forming a semiconductor structure, comprising:
   forming a first layer of a nitride semiconductor material;
   forming a substantially relaxed nitride interlayer on the first layer of nitride semiconductor material, the substantially relaxed nitride interlayer having a first lattice constant, wherein the nitride interlayer comprises aluminum and gallium and is conductively doped with an n-type dopant; and
   forming a second layer of the nitride semiconductor material, wherein the first layer of the nitride semiconductor material, the nitride interlayer, and the second layer of the nitride semiconductor material have a combined thickness of at least about 0.5 μm;
   forming a plurality of discrete portions in the nitride interlayer, wherein the discrete portions have a material composition that is different than a material composition of the nitride interlayer;
   wherein the first layer of the nitride semiconductor material is tensile strained; and
   wherein the nitride semiconductor material has a second lattice constant such that the first layer of nitride semiconductor material is more tensile strained on one side of the substantially relaxed nitride interlayer than the second layer of nitride semiconductor material is on the other side of the substantially relaxed nitride interlayer.

2. The method of claim 1, wherein the second layer of the nitride semiconductor material is formed to be compressively strained on one side of the substantially relaxed nitride interlayer and wherein the first layer of the nitride semiconductor material is formed to be tensile strained on the other side of the substantially relaxed nitride interlayer.

3. The method of claim 1, further comprising:
   forming a discontinuous mask layer directly on the substantially relaxed nitride interlayer before forming the second layer of the nitride semiconductor material.

4. The method of claim 3, wherein the discontinuous mask layer comprises SiN and/or MgN.

5. The method of claim 3, wherein the discontinuous mask layer comprises BN.

6. The method of claim 3, further comprising forming a second discontinuous mask layer directly on the first nitride layer, wherein the nitride interlayer is formed on the second discontinuous mask layer.

7. The method of claim 1, wherein the nitride interlayer is doped with silicon at a concentration of about $1\times10^{19}$ cm$^{-3}$ to about $1\times10^{21}$ cm$^{-3}$.

8. The method of claim 1, wherein the nitride interlayer comprises a graded layer.

9. The method of claim 1, wherein forming the nitride interlayer comprises forming a plurality of sub-layers.

10. The method of claim 1, wherein the nitride interlayer comprises a plurality of 1 nAlN: Si/GaN: Si pairs.

11. The method of claim 10, wherein the nitride interlayer comprises a plurality of 1 nAlGaN: Si/GaN: Si pairs.

12. The method of claim 1, wherein forming the first layer of the nitride semiconductor material comprises forming the first layer of nitride semiconductor material on a substrate, wherein the nitride semiconductor material has a first coefficient of thermal expansion and the substrate has a second coefficient of thermal expansion that is less than the first coefficient of thermal expansion such that the second layer tends to be more tensile strained at room temperature than at an elevated growth temperature.

13. The method of claim 1, wherein the first layer and the second layer have less bow at a temperature of about 700 to 800° C. than at a growth temperature of the nitride layer.

14. The method of claim 1, wherein the interlayer has a thickness and resistivity such that a voltage drop across the interlayer is less than 0.1V.

15. The method of claim 14, wherein the interlayer has a thickness of about 0.015 μm and a resistivity less than about 2000 ohm-cm at a current density of about 32 A/cm$^2$.

16. The method of claim 1, wherein forming the nitride interlayer comprises forming the nitride interlayer at a temperature of about 800° C.

17. The method of claim 1, wherein forming the first layer comprises forming the first layer to have a thickness of less than about 0.5 μm.

18. The method of claim 1, wherein the nitride interlayer comprises a first nitride interlayer having a material composition and a doping, the method further comprising:
forming a second nitride interlayer on the second layer of nitride semiconductor material, wherein the second nitride interlayer comprises aluminum and gallium and is conductively doped with an n-type dopant, and wherein the second nitride interlayer has a material composition and/or doping concentration that is different from the material composition and/or doping concentration of the first nitride interlayer; and
forming a third layer of the nitride semiconductor material on the second nitride interlayer.

19. The method of claim 18, wherein the first nitride layer has a first gallium concentration and the second nitride layer has a second gallium concentration that is greater than the first gallium concentration.

20. The method of claim 18, wherein the first nitride layer has a first doping concentration and the second nitride layer has a second doping concentration that is greater than the first doping concentration.

21. The method of claim 1, wherein the nitride interlayer has a first bandgap and the discrete portions have a second bandgap that is lower than the first bandgap.

22. The method of claim 1, wherein the discrete portions are formed to be present in the nitride interlayer in an amount of between about 40 μm$^2$ and 60 μm$^2$.

23. The method of claim 1, wherein the discrete portions are formed to have a diameter between 0.01 μm and 0.1 μm.

24. The method of claim 1, further comprising etching a layer of the semiconductor structure, wherein the nitride interlayer is used as an etch stop layer.

25. The method of claim 24, further comprising using the etch stop layer for etch removal of the first layer of a nitride semiconductor material.

* * * * *

UNITED STATES PATENT AND TRADEMARK OFFICE
CERTIFICATE OF CORRECTION

PATENT NO. : 8,324,005 B2  
APPLICATION NO. : 12/907556  
DATED : December 4, 2012  
INVENTOR(S) : Saxler et al.

Page 1 of 1

It is certified that error appears in the above-identified patent and that said Letters Patent is hereby corrected as shown below:

On Title Page:

Page 2, Other Publications, right column, lines 67 and 68:

Please correct "Dadgar at al. "Gallium-nitride-based devices on silicon" *phys. stat. sol. (c)* 0(6): 1940-1949."
to read -- Dadgar et al. "Gallium-nitride-based devices on silicon" *phys. stat. sol. (c)* 0(6): 1940-1949 (2003). --

Page 4, Line 17, "Zhang et al." Please correct "837:E3." to read -- 831:E3. --

In the Claims:
Column 19, Claim 10, Line 9: Please correct "1 nAlN: Si/GaN: Si"
to read -- InAlN:Si/GaN:Si --

Claim 11, Line 12: Please correct "1 nAlGaN: Si/GaN: Si"
to read -- InAlGaN:Si/GaN:Si --

Signed and Sealed this
Twentieth Day of August, 2013

Teresa Stanek Rea
*Acting Director of the United States Patent and Trademark Office*